United States Patent
Zhang et al.

(10) Patent No.: US 10,020,317 B2
(45) Date of Patent: Jul. 10, 2018

(54) MEMORY DEVICE WITH MULTI-LAYER CHANNEL AND CHARGE TRAPPING LAYER

(71) Applicant: Cypress Semiconductor Corporation, San Jose, CA (US)

(72) Inventors: Renhua Zhang, Santa Clara, CA (US); Lei Xue, Saratoga, CA (US); Rinji Sugino, San Jose, CA (US); Krishnaswamy Ramkumar, San Jose, CA (US)

(73) Assignee: Cypress Semiconductor Corporation, San Jose, CA (US)

(*) Notice: Subject to any disclaimer, the term of this patent is extended or adjusted under 35 U.S.C. 154(b) by 0 days.

(21) Appl. No.: 15/078,156

(22) Filed: Mar. 23, 2016

(65) Prior Publication Data
US 2017/0263623 A1    Sep. 14, 2017

Related U.S. Application Data

(60) Provisional application No. 62/212,315, filed on Aug. 31, 2015, provisional application No. 62/279,068, filed on Jan. 15, 2016.

(51) Int. Cl.
*H01L 27/11582* (2017.01)
*H01L 29/51* (2006.01)
(Continued)

(52) U.S. Cl.
CPC .. *H01L 27/11582* (2013.01); *H01L 21/02532* (2013.01); *H01L 21/02636* (2013.01); *H01L 21/28282* (2013.01); *H01L 21/31111* (2013.01); *H01L 21/76895* (2013.01); *H01L 23/528* (2013.01); *H01L 29/04* (2013.01);
(Continued)

(58) Field of Classification Search
CPC ............. H01L 27/11582; H01L 29/167; H01L 29/161; H01L 29/1037; H01L 29/04; H01L 29/518; H01L 29/513; H01L 21/02636; H01L 23/528; H01L 21/28282; H01L 21/31111; H01L 21/02532; H01L 21/76895
See application file for complete search history.

(56) References Cited

U.S. PATENT DOCUMENTS 6,313,487 B1   11/2001  Kencke et al.
6,709,935 B1    3/2004  Yu
(Continued)

OTHER PUBLICATIONS

International Search Report for International Application No. PCT/US2016/038229 dated Oct. 31, 2016; 4 pages.
(Continued)

*Primary Examiner* — Selim Ahmed

(57) ABSTRACT

A 3-D/vertical non-volatile (NV) memory device such as 3-D NAND flash memory and fabrication method thereof, the NV memory device includes vertical openings disposed in a stack of alternating stack layers of first stack layers and second stack layers over a wafer, a multi-layer dielectric disposed over an inner sidewall of each opening, a first channel layer disposed over the multi-layer dielectric, and a second channel layer disposed over the first channel layer, in which at least one of the first or second channel layers includes polycrystalline germanium or silicon-germanium.

20 Claims, 18 Drawing Sheets

(51) Int. Cl.

| | | |
|---|---|---|
| *H01L 29/161* | (2006.01) | |
| *H01L 29/10* | (2006.01) | |
| *H01L 29/04* | (2006.01) | |
| *H01L 29/167* | (2006.01) | |
| *H01L 21/02* | (2006.01) | |
| *H01L 23/528* | (2006.01) | |
| *H01L 21/28* | (2006.01) | |
| *H01L 21/311* | (2006.01) | |
| *H01L 21/768* | (2006.01) | |

(52) U.S. Cl.
CPC ........ *H01L 29/1037* (2013.01); *H01L 29/161* (2013.01); *H01L 29/167* (2013.01); *H01L 29/513* (2013.01); *H01L 29/518* (2013.01)

(56) References Cited

U.S. PATENT DOCUMENTS

| | | | |
|---|---|---|---|
| 6,977,400 B2 | 12/2005 | Puchner et al. | |
| 6,995,054 B2 | 2/2006 | Oda et al. | |
| 7,274,068 B2 | 9/2007 | Forbes | |
| 8,592,891 B1* | 11/2013 | Polishchuk | H01L 21/28282 257/324 |
| 2010/0322009 A1* | 12/2010 | Shimane | G11C 16/0483 365/185.18 |
| 2013/0193514 A1* | 8/2013 | Loubet | H01L 21/84 257/347 |
| 2013/0248977 A1 | 9/2013 | Mori et al. | |
| 2014/0273373 A1* | 9/2014 | Makala | H01L 27/11582 438/270 |
| 2015/0072488 A1* | 3/2015 | Chien | H01L 29/66825 438/264 |
| 2015/0076584 A1* | 3/2015 | Pachamuthu | H01L 21/28282 257/315 |
| 2015/0115348 A1* | 4/2015 | Nam | H01L 27/11582 257/324 |
| 2015/0137268 A1 | 5/2015 | Fung | |
| 2015/0171106 A1* | 6/2015 | Suh | H01L 27/11582 257/324 |
| 2015/0236126 A1* | 8/2015 | Park | H01L 27/2454 438/268 |

OTHER PUBLICATIONS

Jagan Singh Meena, et al., Overview of Emerging Nonvolatile Memory Technologies,, Sep. 25, 2014, 33 pages.

Kuei-Shu Chang-Liao, et al., Improved Operation Characteristics for Charge-trapping Flash Memory Devices with SiGe Buried Channel and Stacked Charge-trapping Layers, Nov. 2010, 2 pages. Solid-State Devices and Integration Technologies Division, Institute of Microelectronics, Tsinghua Univ., 9 pages.

Written Opinion of the International Searching Authority for International Application No. PCT/US2016/038229 dated Oct. 31, 2016; 8 pages.

* cited by examiner

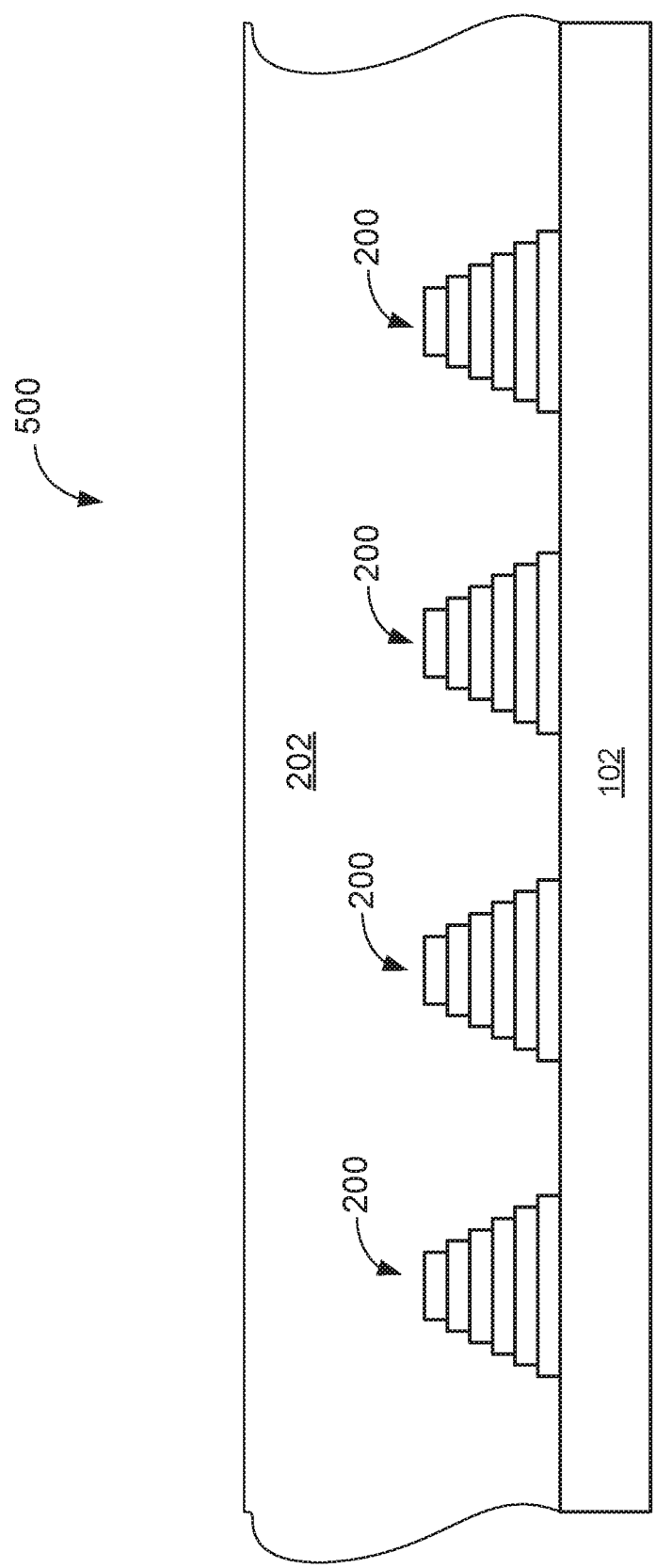

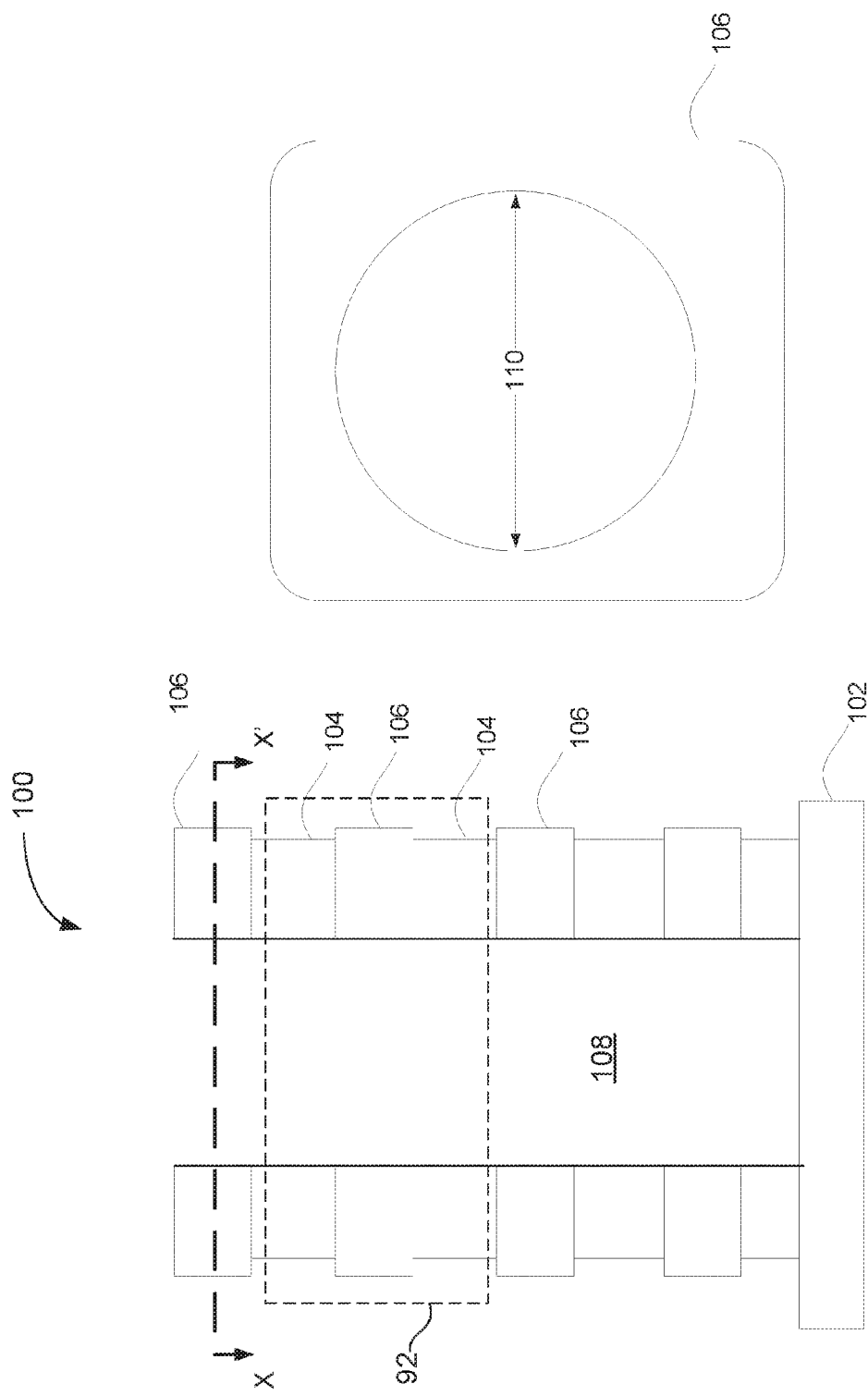

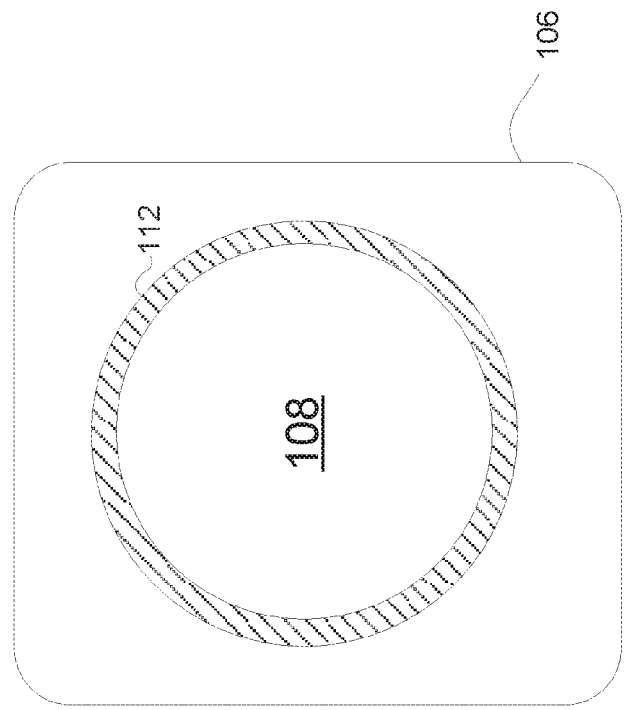
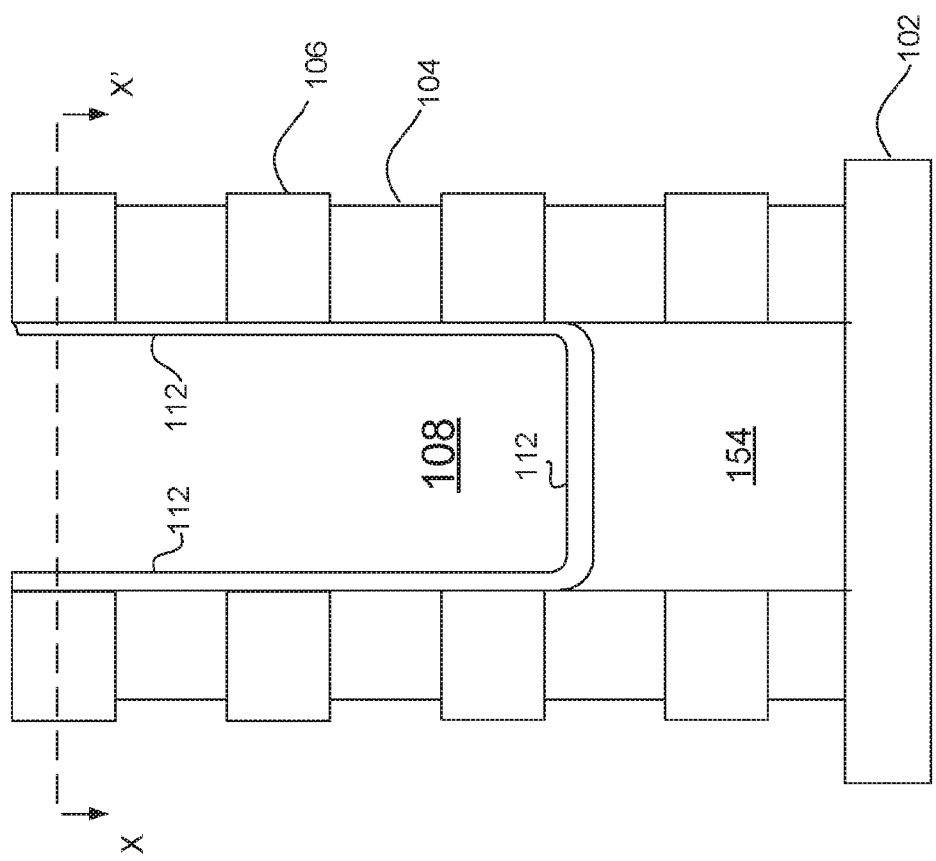

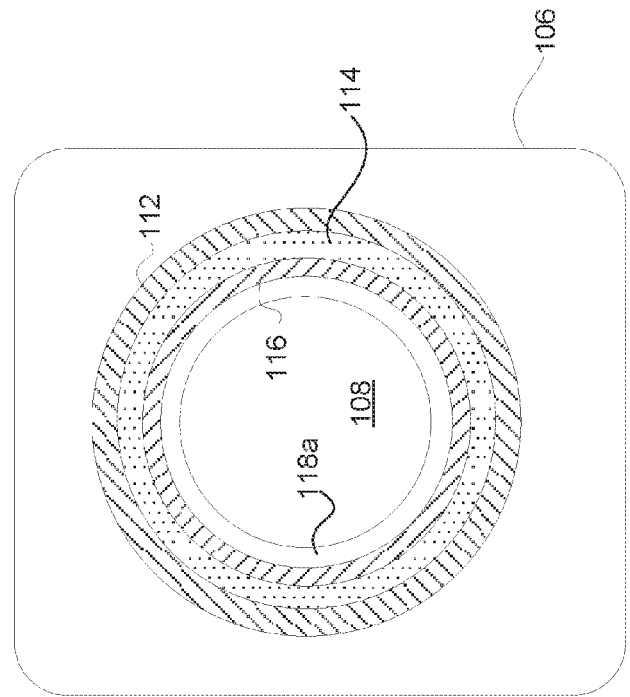
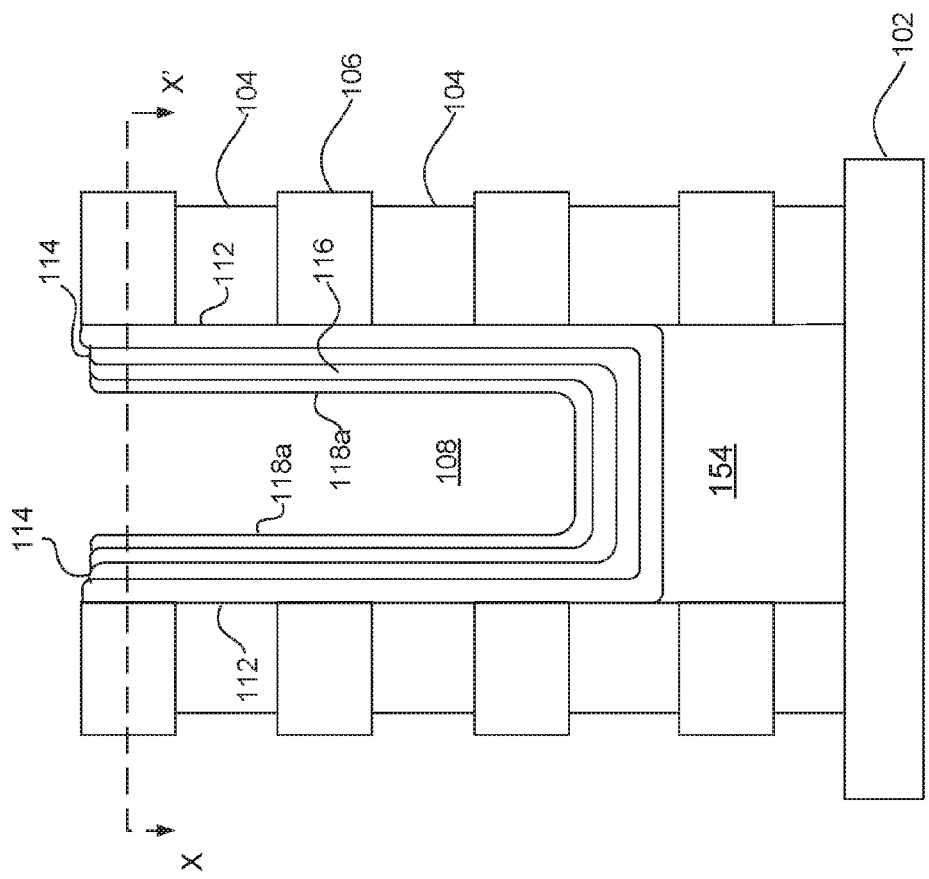
FIG. 2O
FIG. 2N

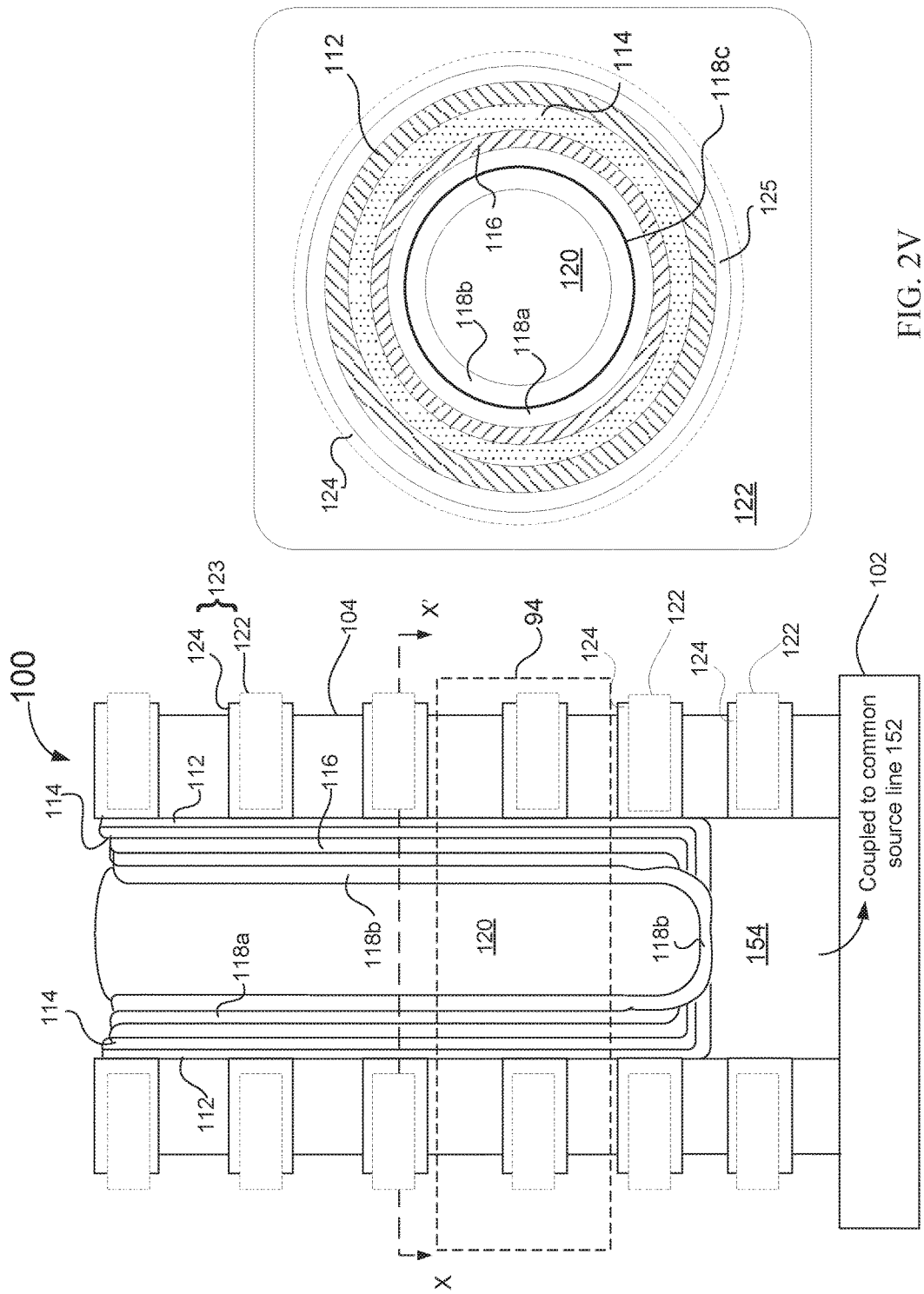

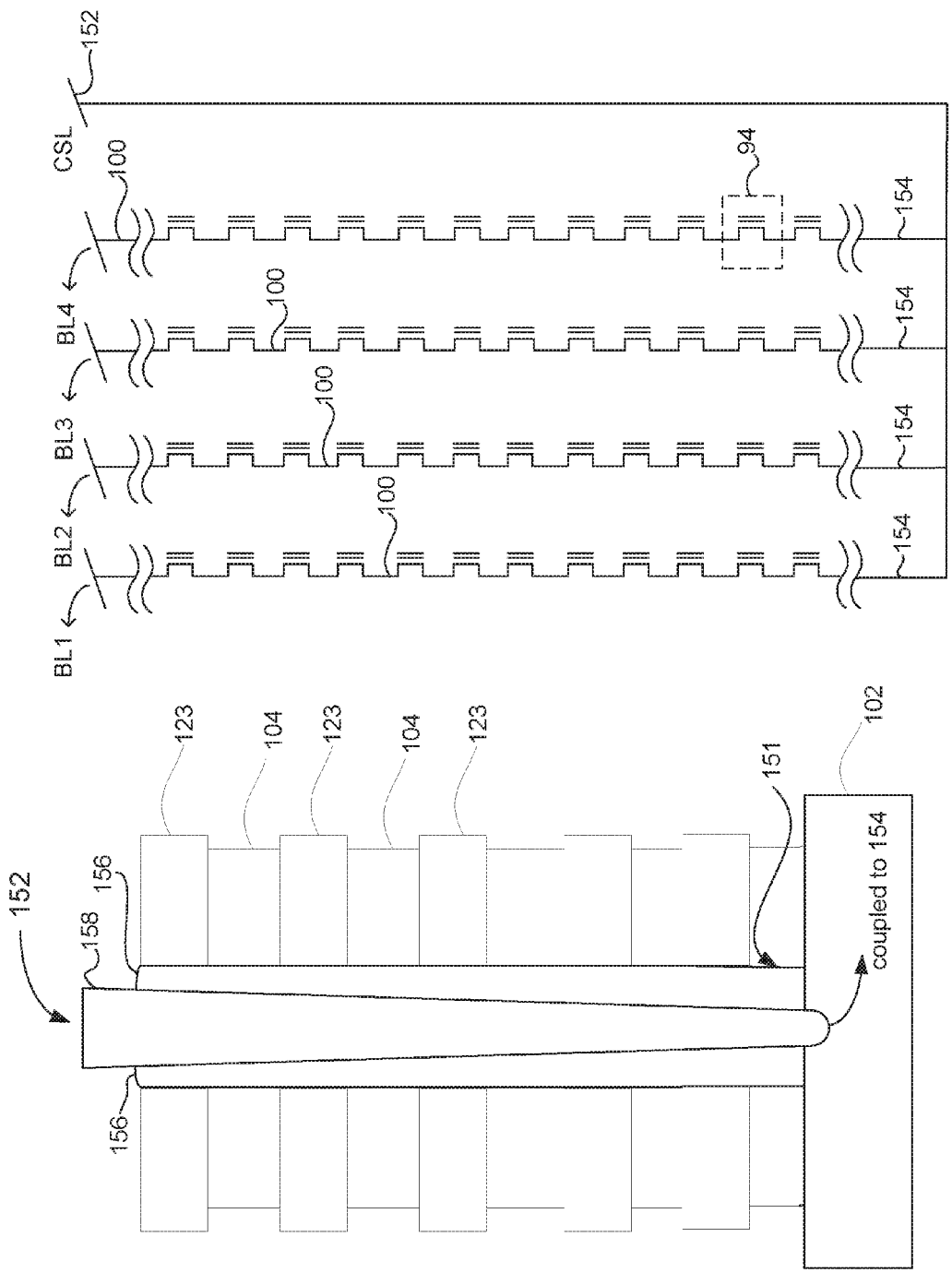

MEMORY DEVICE WITH MULTI-LAYER CHANNEL AND CHARGE TRAPPING LAYER

PRIORITY

The present application claims the priority and benefit under 35 U.S.C. § 119(e) of U.S. Provisional Application No. 62/212,315, filed on Aug. 31, 2015, which is incorporated by reference herein in its entirety. The present application also claims the priority and benefit under 35 U.S.C. § 119(e) of U.S. Provisional Application No. 62/279,068, filed on Jan. 15, 2016, which are both incorporated by reference herein in its entirety.

TECHNICAL FIELD

The present disclosure relates generally to non-volatile (NV) memory devices, and more particularly to three-dimensional (3-D) or vertical NV memory cell strings and methods of manufacturing thereof including forming multiple layer channel and/or charge trapping layer.

BACKGROUND

Flash memory, both the NAND and NOR types, includes strings of NV memory elements or cells, such as floating-gate metal-oxide-semiconductor field-effect (FGMOS) transistors and silicon-oxide-nitride-oxide-silicon (SONOS) transistors. The fabrication of two-dimensional or planar flash memory devices is down to 10-nm lithography, and the reduction in scale has started to create potential issues as each NV memory element is getting smaller and physically closer to one another. In these NV memory elements, their charge trapping gates hold much fewer electrical charges due to the smaller scale. As a result, any small imperfection in the fabrication process may cause logic/memory states of the NV memory elements to become difficult to differentiate, which may result in a false reading of logic states. Moreover, control electrodes are getting so small and closely spaced that their effects, such as in biasing gates, may spread over more than one memory cells or strings, which may lead to unreliable reading and writing of data.

To overcome the limitations of available area on a semiconductor substrate, in 3-D or vertical geometry, NV memory cell strings are oriented vertically and NV memory cells are stacked on a semiconductor substrate. Accordingly, memory bit density is much enhanced compared to the two-dimensional (2-D) geometry having a similar footprint on the substrate.

In 3-D NV memory cell strings, channels are disposed inside openings formed in a dielectric/gate stack on a substrate. In certain applications, channels are mainly composed of polycrystalline silicon (Poly-Si), allowing electric current (charge carriers) to flow along the channels. Poly-Si channels may include silicon crystals of small grain sizes, contributing to more severe potential defects such as grain boundaries. Defects such as grain boundaries may cause charge carriers to scatter. As a result, the current flowing along channels may be reduced significantly. In 3-D memory cell strings, such as 3-D NAND, the reduction in reading current may affect the margin for read operations adversely. Moreover, in order to maintain a threshold reading or on-current, the number of layers in the dielectric/gate stack will be restricted, which in turn limit the number of memory cells (FGMOS, SONOS, etc.) in one NV memory string.

BRIEF DESCRIPTION OF THE DRAWINGS

The present disclosure is illustrated by way of example, and not by way of limitation, in the FIGS. of the accompanying drawings.

DETAILED DESCRIPTION

Figure 1:
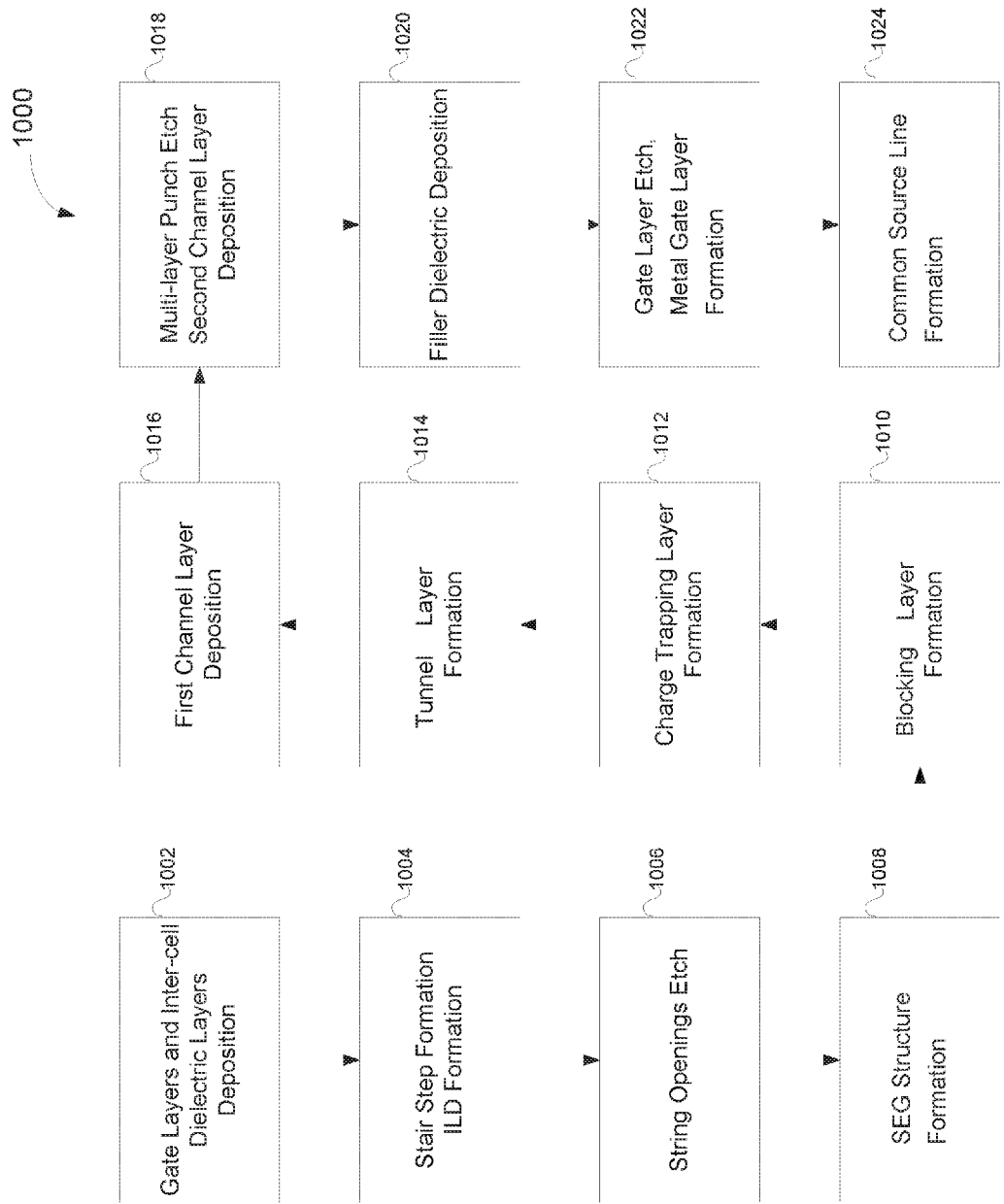
FIG. 1 is a flowchart illustrating an embodiment of a method for fabricating a vertical NV memory device including strings of NV memory cells.

The following description sets forth numerous specific details such as examples of specific systems, components, methods, and so forth, in order to provide a good understanding of several embodiments of the present subject matter. It will be apparent to one skilled in the art, however, that at least some embodiments may be practiced without these specific details. In other instances, well-known components or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the present subject matter.

Embodiments of a vertical or three-dimensional (3-D) non-volatile (NV) memory device including strings of non-volatile memory (NVM) transistors and/or field-effect transistors (FET), and methods of fabricating the same are described herein with reference to figures. It is the understanding that NV memory includes memory devices that retain their states even when operation power is removed. While their states may eventually dissipate, they are retained for a relatively long period of time. However, particular embodiments may be practiced without one or more of these specific details, or in combination with other known methods, materials, and apparatuses. In the following description, numerous specific details are set forth, such as specific materials, dimensions, concentrations, and processes parameters etc. to provide a thorough understanding of the present subject matter. In other instances, well-known semiconductor design and fabrication techniques have not been described in particular detail to avoid unnecessarily obscuring the present subject matter. Reference in the description to "an embodiment", "one embodiment", "an example embodiment", "some embodiments", and "various embodiments" means that a particular feature, structure, or characteristic described in connection with the embodiment(s) is included in at least one embodiment of the subject matter. Further, the appearances of the phrases "an embodiment", "one embodiment", "an example embodiment", "some embodiments", and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

The terms "over", "overlying", "under", "between", and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting wafer without consideration of the absolute orientation of the wafer.

SUMMARY OF EMBODIMENTS

A memory device including an opening or openings disposed in a stack including first stack layers and second stack layers over a wafer, a multi-layer dielectric disposed over at least an inner sidewall of the openings, a first channel layer disposed over the multi-layer dielectric, and a second channel layer disposed over the first channel layer, in which at least one of the first or second channel layers includes germanium (Ge). In some embodiments, the openings may be substantially perpendicular to a top surface of the wafer and may include a cross-sectional shape selected from a group of circle, oval, square, diamond, and rectangle. In one embodiment, the first and second stack layers may be disposed over one another in an alternating manner to form the stack, the first stack layers include silicon dioxide ($SiO_2$) or other dielectric, and each of the second stack layers includes a gate layer, wherein the gate layer may include one of a doped polycrystalline silicon (Poly-Si) layer or a tungsten/titanium nitride (W/TiN) composite layer or other metal gate layers.

In one embodiment, at least one of the first or second channel layers may include a silicon-germanium (Si—Ge) composite layer, and the Si—Ge composite layer may include Ge concentration by number of atoms in an approximate range of 5% to 95%. In another embodiment, the first and second channel layers may include a poly-crystalline structure.

In one embodiment, at least one additional channel layer may be disposed over the second channel layer, wherein the at least one additional channel layer includes Ge.

In one embodiment, there may be a channel interface between the first and second channel layers, wherein the first and second channel layers are deposited in two separated deposition steps and each includes a silicon-germanium composite layer of different Ge concentration.

In one embodiment, the multi-layer dielectric may include a blocking dielectric layer disposed over at least the inner sidewall of the openings, a charge-trapping layer over the blocking dielectric layer, and a tunnel dielectric layer over the charge-trapping layer, wherein the charge-trapping layer may include a multi-layer structure. In another embodiment, the multi-layer structure of the charge-trapping layer may include an outer nitride layer, a middle dielectric layer, and an inner nitride layer, wherein at least one of the outer or inner nitride layers may include silicon oxynitride. Moreover, one of the outer and inner nitride layers may be oxygen-rich and the other may be silicon-rich, and wherein the middle dielectric layer may be oxygen-rich and mostly charge-trap free.

In one embodiment, at least one of the first or second channel layers is positively doped and may include a dopant selected from a group of boron, gallium, or indium, and doped at an approximate concentration range of $1e15$ $cm^{-3}$ to $1e18$ $cm^{-3}$.

In one embodiment, a thickness ratio between the first and the second channel layers may be in an approximate range of 1:5 to 1:0.2.

Figure 2A:
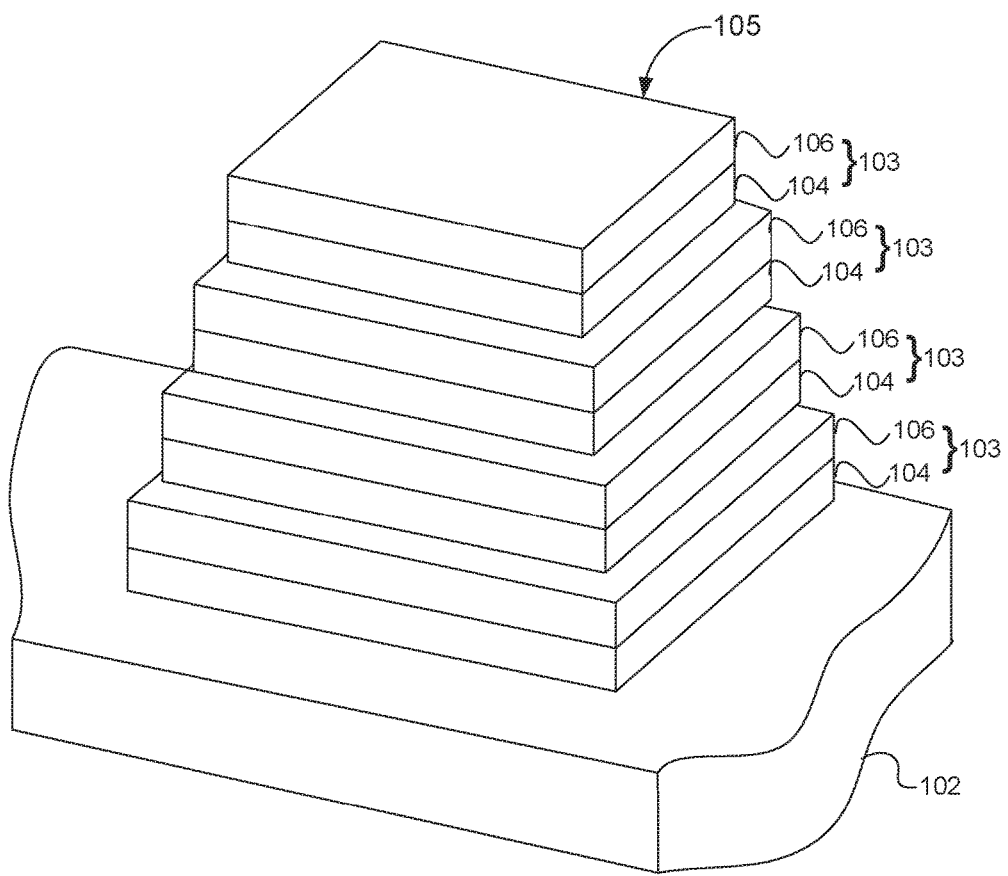
FIGS. 2A and 2B are representative diagrams illustrating isometric views of a portion of a vertical NV memory device during fabrication according to the method of FIG. 1.

The NVM transistor may include memory transistors or devices related to Silicon-Oxide-Nitride-Oxide-Silicon (SONOS) or floating gate technology. An embodiment of a method for fabricating a vertical memory device including string(s) of NV memory elements will now be described in detail with reference to FIG. 1 and FIGS. 2A through 2Y. FIG. 1 is a flowchart illustrating an embodiment of a method or process flow for fabricating a 3-D or vertical NV memory device. FIGS. 2A-2T are block and schematic diagrams illustrating cross-sectional and isometric views of a portion of a vertical NV memory device during fabrication of the memory cells according to the method of FIG. 1. FIGS. 2U-2Y are representative diagrams illustrating a cross-sectional view of a portion of one embodiment of the finished memory device or array. In one embodiment, the vertical NV memory device may include a single or multiple vertical memory cell strings, such as NAND flash memory strings.

Referring to FIG. 1 and FIG. 2A, the fabrication process 1000 begins with forming a stack 105 of alternating layers of multiple inter-cell dielectric layers or first stack layers 104 and gate layers or second stack layers 106 over a substrate or wafer 102, in step 1002 of fabrication process 1000. In one embodiment, each inter-cell dielectric layer 104 is stacked between two gate layers 106 and vice versa, either throughout the entire stack 105 or at least in parts of stack 105. Wafer 102 may be a bulk wafer composed of any single crystal material suitable for semiconductor device fabrication, or may include a top epitaxial layer of a suitable material formed on a wafer. In one embodiment, suitable materials for wafer 102 include, but are not limited to, silicon, germanium, silicon-germanium or a Group III-V compound semiconductor material. In one embodiment, stack 105 is formed adopting a stair geometry or a pyramid configuration having a plurality of steps. In one embodiment, each step includes an inter-cell dielectric layer 104 and a gate layer 106 to form a pair 103. According to the stair geometry formed in step 1004, in one embodiment, the surface area of inter-cell dielectric layer 104 and gate layer 106 pair 103 may get smaller as they are disposed higher in stack 105. The stair geometry of stack 105 may facilitate more effective word-line connections to gate layers 106. In other embodiments, stack 105 may adopt other configurations and all inter-cell dielectric layer 104 and gate layer 106 pairs 103 may have approximately the same surface area. As illustrated in FIG. 2A, inter-cell dielectric layer 104 of the bottom pair 103 may be disposed directly overlying and in contact with wafer 102, or there may be intervening layers between them (not shown). In one embodiment, the intervening layers may be dielectric layers, gate layers, semiconductor layers used to manufacture intervening devices between the string of NV memory cells and wafer 102. In another embodiment, there may be additional layers formed over the top inter-cell dielectric layer 104 and gate layer 106 pair 103 of the stack 105. In one embodiment, the bottom intervening layers and top additional layers may be utilized to form semiconductor devices other than NV memory cells, such as field-effect transistors (FET) or connecting elements according to system requirements.

In one embodiment, inter-cell dielectric layers 104 may be formed by any suitable deposition methods known in the art, such as sputtering, chemical vapor deposition (CVD), molecular beam epitaxy (MBE), atomic layer deposition (ALD), etc. The inter-cell dielectric layers 104 may include silicon dioxide ($SiO_2$) or other dielectric material having a thickness of from about 20 nanometers (nm) to about 50 nm or other appropriate thicknesses. In some embodiments, inter-cell dielectric layers 104 may have variable thicknesses throughout stack 105. In one alternative embodiment, some or all of the inter-cell dielectric layers 104 may be grown by a thermal oxidation process, in-situ steam generation process, or plasma or radical oxidation technique.

Generally, gate layers 106 may eventually become or electrically coupled to control gates of NV transistors in vertical NV memory device 200 (not shown in this figure). In one embodiment, gate layers 106 may be coupled to word-lines. As best shown in FIG. 2A, gate layers 106 may be formed over a top surface of each inter-cell dielectric layer 104. In one embodiment, when polysilicon control gates are desired, gate layers 106 may be formed by a deposition process like those discussed above, and include a single doped polysilicon layer, either positively or negatively doped (p+ doped or n+ doped) with appropriate dopants and concentration known in the art. The gate layers 106 may have a thickness of from about 30 nm to about 60 nm or other thicknesses. In some embodiments, gate layers 106 may have variable thicknesses throughout stack 105. In one alternative embodiment, when metal control gates are desired, gate layers 106 may be formed by a deposition process and composed of a single layer of silicon nitride ($Si_3N_4$) having a thickness of from about 30 nm to about 60 nm or other thicknesses. Gate layers 106 that are composed of silicon nitride, may then be replaced by or converted to metal gate layers 123 in step 1022, which will be discussed in later sections.

Figure 2B:
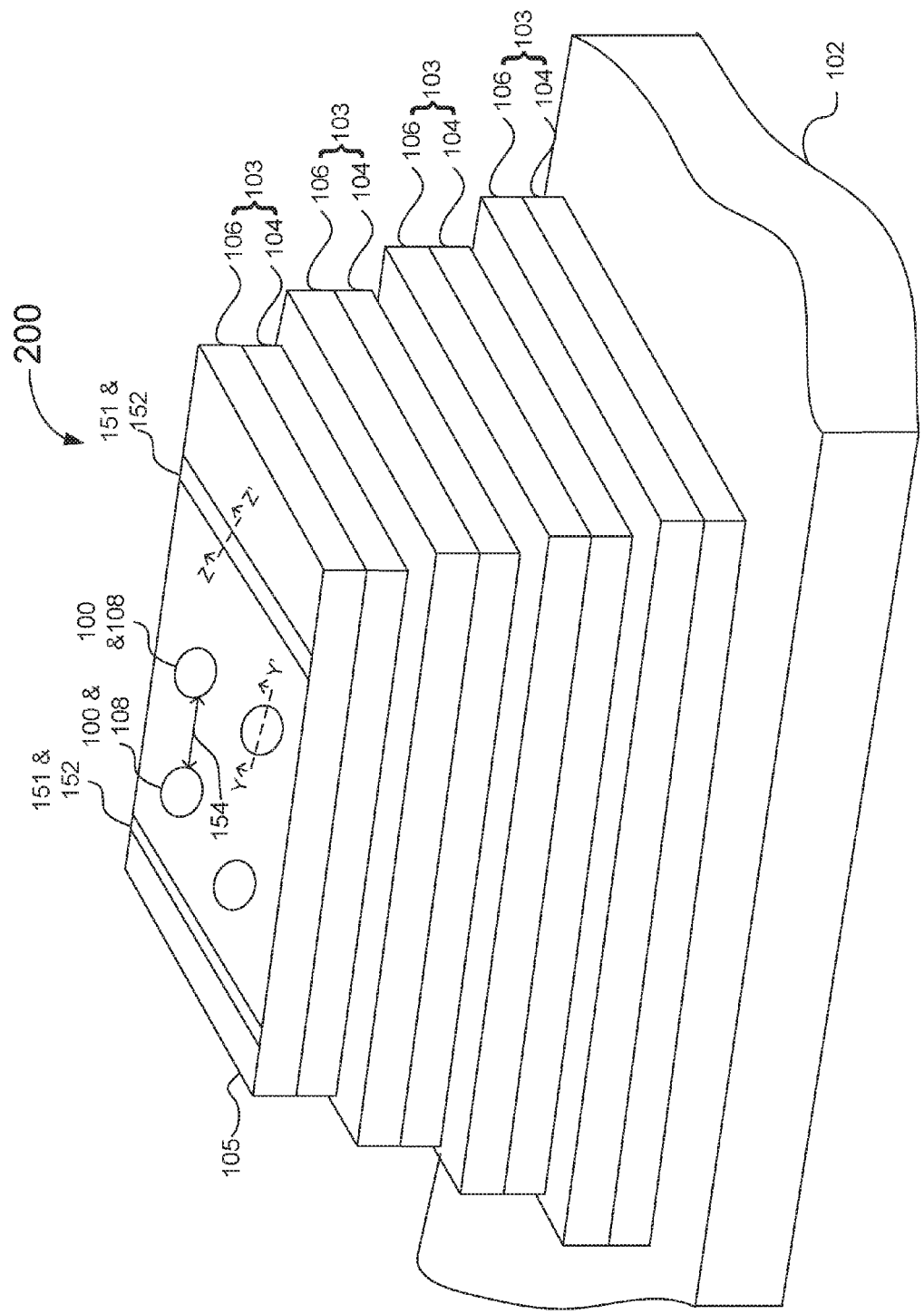

Referring to FIG. 1 and FIG. 2B, vertical openings 108, which are substantially perpendicular to the plane of wafer 102, may be formed in locations where vertical channels of NV memory cell strings 100 of vertical NV memory device 200 may be subsequently formed. In one embodiment, there may be multiple NV memory cell strings 100 in one vertical NV memory device 200. It is the understanding that the vertical axis of openings 108 may be disposed at a right angle (90°) or an approximate right angle to the top surface of wafer 102. In one embodiment, openings 108 may be formed by etching stack 105 using suitable etching processes, such as plasma etching, wet etching, etc. There may be a plurality of slits 151 to form common source line (CSL) 152 in stack 105 in block 1024. In one embodiment, slits 151 are deep trenches formed throughout stack 105.

As illustrated in FIG. 2C, an NV memory array 500 may include multiple vertical NV memory devices 200 disposed on wafer 102. In one embodiment, a layer of dielectric, such as $SiO_2$, is formed and subsequently planarized to form interlayer dielectric layer (ILD) 202, in step 1004.

FIG. 2D features a side cross-sectional view along line Y-Y' of FIG. 2B and FIG. 2E features a top cross-sectional view along X-X' of FIG. 2D. In one embodiment, openings 108 may be etched to reach or beyond a top surface of wafer 102, in step 1006. Optical emission intensity and/or spectroscopic reflectometry technique may be used to detect the end point of and subsequently terminate the openings 108 formation process. Openings 108 may have an approximately uniform diameter 110 of from about 60 nm to about 130 nm or other dimensions throughout the entirety of stack 105. In other embodiments, openings 108 may have a variable cross-sectional diameter, such as a tapered shape (not shown). There may be multiple openings 108 formed in a single stack 105 of vertical NV memory device 200. To ensure proper operations and insulation of the vertical NV memory cell strings 100, each opening 108 may be distributed to maintain a minimum spacing, which is the distance from the perimeter of one opening 108 to another. In one embodiment, the minimum spacing may be maintained at about 20 nm to about 130 nm or other dimensions. In another embodiment, openings 108 may be distributed such that NV memory cells in area 92 to be formed may share the same set of control gates and connections to the same set of word-lines and/or CSL 152.

Figure 2F:
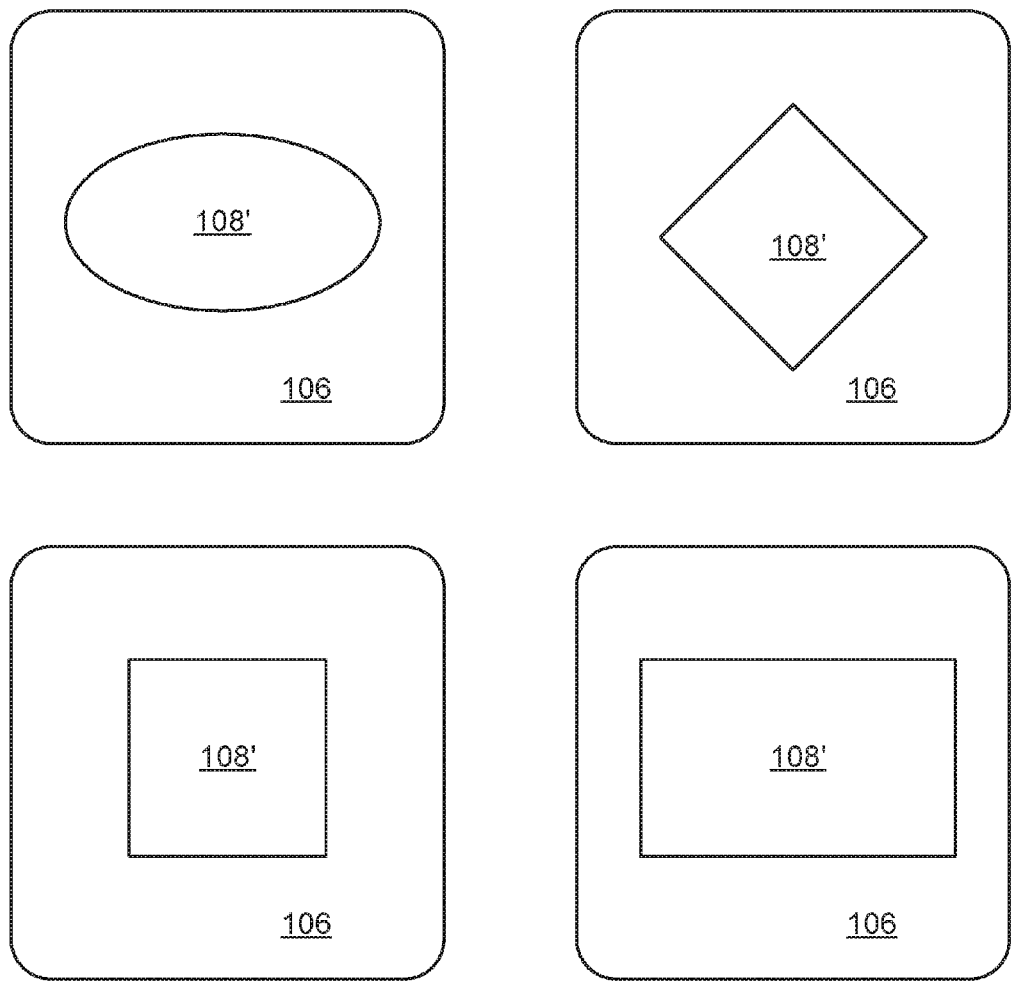
FIG. 2C is a representative cross-sectional view of a portion of a vertical NV memory array.
FIGS. 2D to 2T are representative diagrams illustrating cross-sectional views of a portion of a vertical NV memory device during fabrication according to the method of FIG. 1.
FIGS. 2U to 2Y are representative diagrams illustrating cross-sectional views and a schematic diagram of a portion of a finished vertical NV memory device including multiple vertical strings of NV memory cells and common source line fabricated according to the method of FIGS. 1 and 2A to 2T.

Referring to FIG. 1, FIGS. 2D and 2E, a portion of vertical NV memory device 200 featuring a single opening 108 (one NV memory cell string 100 when completed), having four alternating inter-cell dielectric layers 104 and gate layers 106, is illustrated. It will be the understanding that this is an exemplary embodiment, for illustration and not limitation purposes, to illustrate the subject matter as vertical NV memory device 200 may have other quantities and combinations of openings 108, alternating inter-cell dielectric layers 104 and gate layers 106 pair 103. Moreover, a vertical NV memory device 200 may include additional semiconductor devices formed at its two ends (in top additional layers and bottom intervening layers as discussed above). A vertical NV memory device 200 that has multiple openings 108 may contain multiple NV memory cell strings 100, each may be fabricated in similar processes, either concurrently or sequentially. In one embodiment, a vertical NV memory device 200 may be formed in openings 108 by forming a string of NV memory cells 94 in areas 92 connected in series. Each NV memory cell 94 may be formed in the area 92 which includes two inter-cell dielectric layers 104 and one gate layer 106. In one embodiment, NV memory cells 94 of the same NV memory cell strings 100 may be coupled in series, which resembles a NAND flash memory cell string embodiment. As best illustrated in FIG. 2E, opening 108 may have a circular cross-section with a diameter 110 of from about 60 nm to about 130 nm or other dimensions. In other embodiments, as best illustrated in FIG. 2F, opening 108' may have a cross-section of other shapes, such as a square, a rectangle, a diamond, an oval, etc. In some embodiments, openings 108' of other shapes may also maintain a minimum spacing at about 20 nm to about 130 nm from one another.

Figure 2G:
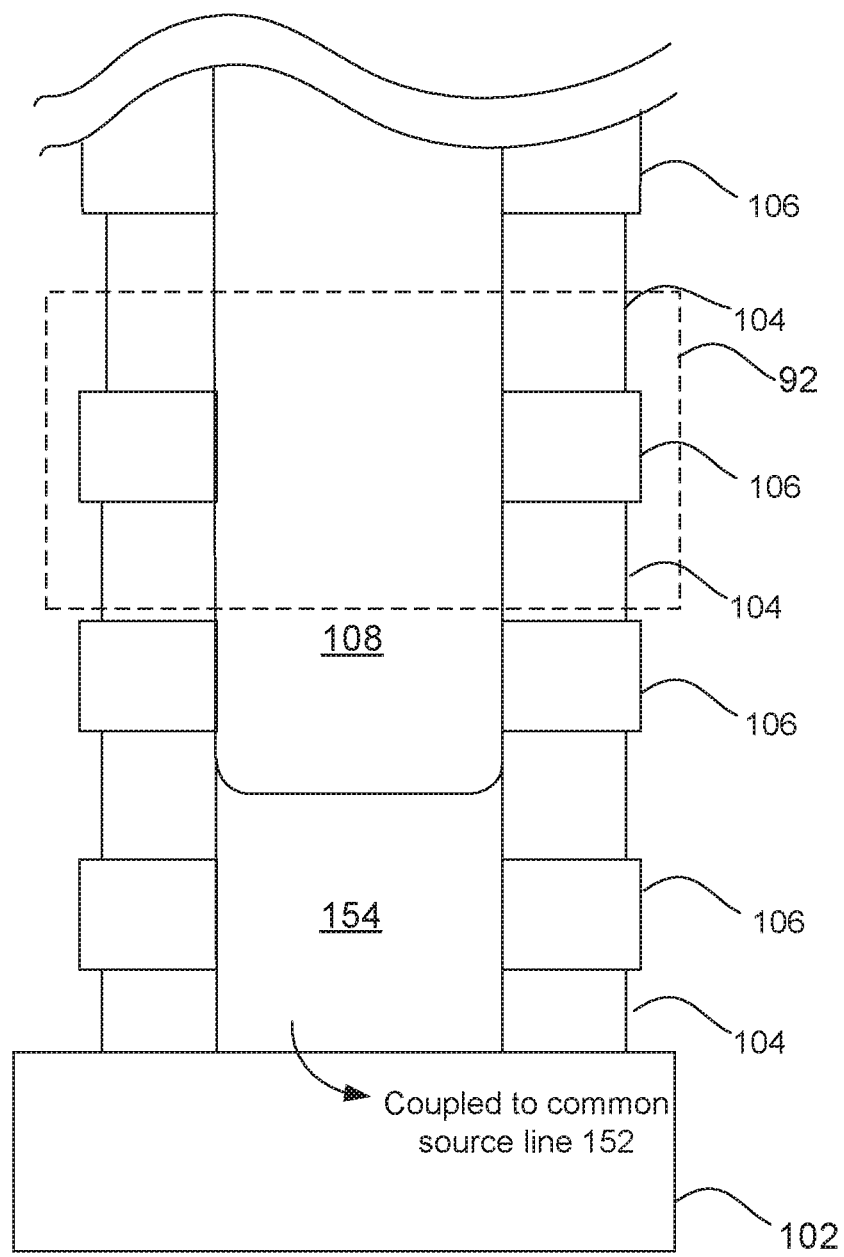

Referring to FIG. 1 and FIG. 2G, selective epitaxial growth (SEG) structure 154 is formed at the bottom of opening 108 and overlying wafer 102, in step 1008. In one embodiment, SEG structure 154 may be disposed in contact with wafer 102 and fills up the bottom of opening 108 corresponding to multiple alternating layers and/or intervening layers in stack 105. SEG structure 154 may be composed of silicon, fabricated using SEG techniques in which growth may occur on exposed silicon areas of wafer 102. Regions on which silicon growth is not desired may be masked by a dielectric film, typically silicon dioxide or silicon nitride. Silicon grown in the SEG structure may be undoped. Alternatively, silicon may be doped. In some embodiments, silicon in SEG structure 154 may be positively doped, negatively doped, and the doping may be in-situ doping. Doping of SEG structure 154, if performed, may be carried out either during the SEG formation step 1008 or after. In one embodiment, SEG structure 154 for each NV memory cell string 100 may be connected to CSL 152 (not shown in this figure) with a coupling structure either formed on or within wafer 102.

FIG. 2H is a side cross-sectional view of one embodiment of a portion of vertical NV memory device 200 and FIG. 2I is a top cross-sectional view along X-X' of FIG. 2H. Referring to FIG. 1, FIGS. 2H and 2I, blocking dielectric layer 112 is formed in opening 108 in step 1010. In one embodiment, blocking dielectric layer 112 may include a single layer or multiple layers, and may include layers of $SiO_2$ or other dielectric materials coating the inside wall of opening 108 and the top surface of SEG structure 154. The blocking dielectric layer 112 may be formed by suitable conformal deposition process, such as CVD and ALD, and have a relatively uniform thickness of about 30 Å to about 70 Å or other thicknesses. For example, the blocking dielectric layer 112 may be deposited by a CVD process using a process gas including gas mixtures of silane or dichlorosilane (DCS) and an oxygen-containing gas, such as $O_2$ or $N_2O$, in ratios and at flow rates tailored to provide a silicon dioxide ($SiO_2$) blocking dielectric layer 112. In another embodiment, blocking dielectric layer 112 may include other high-k dielectric materials, such as hafnium oxide, alternatively or additionally to silicon dioxide. In various other embodiments, such as when gate layers 106 are composed of Poly-Si, blocking dielectric layer 112 may be formed by thermal oxidation or in-situ steam generation or plasma, radical, or other oxidation processes.

Figure 2K:
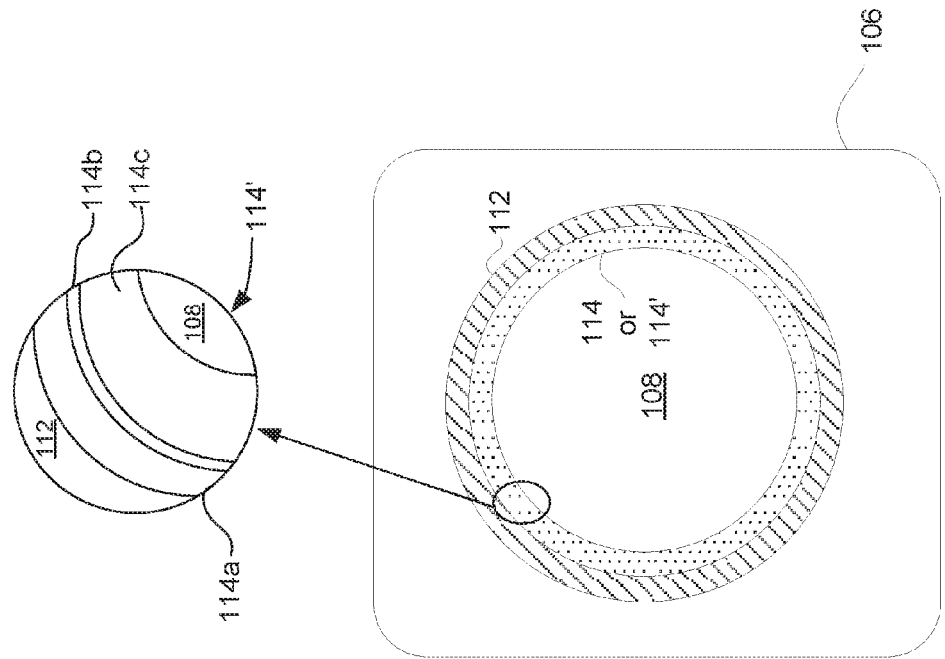
Figure 2J:
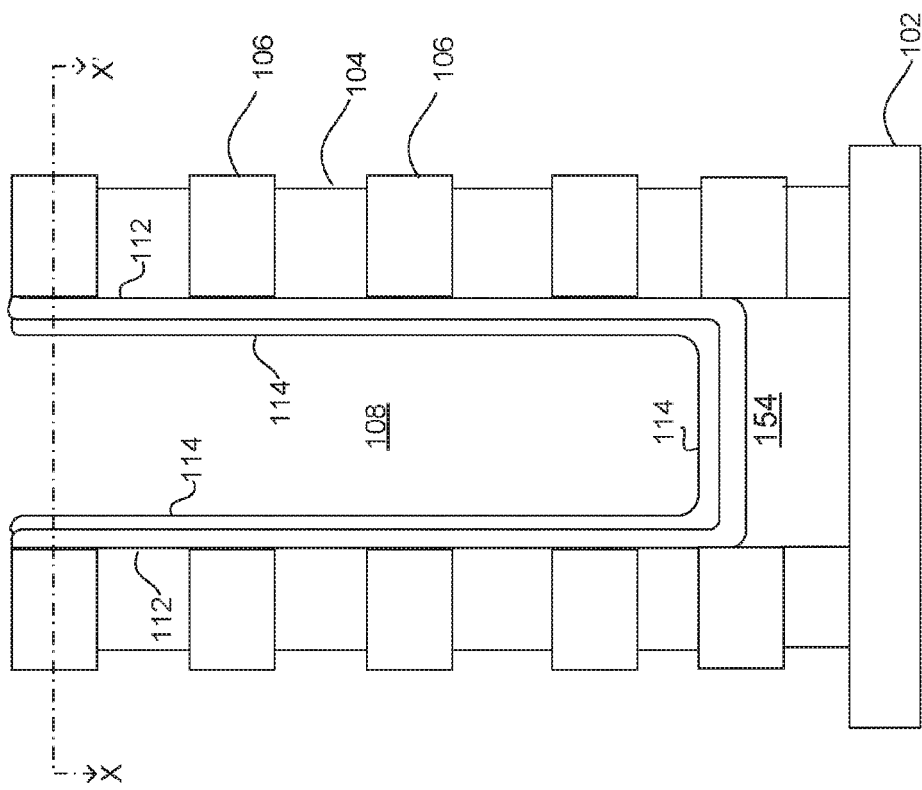

FIG. 2J is a side cross-sectional view of one embodiment of a portion of vertical NV memory device 200 and FIG. 2K is a top cross-sectional view along X-X' of FIG. 2J. Referring to FIG. 1 and FIGS. 2J and 2K, charge-trapping layer 114 is formed in opening 108, in step 1012. In various embodiments, charge-trapping layer 114 is a single layer and may include a layer of silicon nitride and/or silicon oxynitride formed on or overlying or in contact with the blocking dielectric layer 112. The charge-trapping layer 114 may be formed by suitable conformal deposition process, such as CVD and ALD. In one embodiment, charge-trapping layer 114 may have a relatively uniform thickness of from about 50 Å to about 100 Å or other thicknesses. As best shown in FIG. 2J, charge-trapping layer 114 is a continuous layer, or coating the entire length of opening 108. In one embodiment, charge-trapping layer 114 may cover portions where NV memory cells 94 are formed in opening 108. NV memory cells 94 formed in different layers in stack 105 do not interfere with one another because charge carriers trapped in the charge-trapping layer 114 may not move from layer to layer vertically along opening 108. The electric fields associated with gate layers 106 closely confine charge carriers in the charge-trapping layer 114 to the gate layer 106 they are trapped in.

In another embodiment, as illustrated in the exploded view in FIG. 2K, an alternative embodiment of charge trapping layer 114' may include multiple layers including at least a first charge-trapping layer or outer charge-trapping layer 114a that is formed on or overlying or in contact with the blocking dielectric layer 112, and a second charge-trapping layer or inner charge-trapping layer 114c that is formed on or overlying or in contact with the first charge-trapping layer 114a. The first charge-trapping layer 114a may be oxygen-lean relative to the second charge-trapping layer 114c and may comprise a majority of a charge traps distributed in multi-layer charge-trapping layer 114'. In one embodiment, the first charge-trapping layer 114a may include a silicon nitride and silicon oxynitride layer having a stoichiometric composition of oxygen, nitrogen and/or silicon that is different from that of the second charge-trapping layer 114c. The first charge-trapping layer 114a may include a silicon oxynitride layer which may be formed or deposited by a CVD process using a process gas including $DCS/NH_3$ and $N_2O/NH_3$ gas mixtures in ratios and at flow rates tailored to provide a silicon-rich, oxygen-lean top nitride layer. In various other embodiments, mono-silane $SiH_4$ (MS), di-silane $Si_2H_6$ (DS), tetra-chloro-silane $SiCl_4$ (TCS), and hexa-chloro-di-silane $Si_2Cl_6$ (HCD) may be used as a source of silicon in the CVD process. The second charge-trapping layer 114c of a multi-layer charge-trapping layer 114' may include a silicon nitride ($Si_3N_4$), silicon-rich silicon nitride or a silicon oxynitride ($SiO_xN_y$) layer. For example, the second charge-trapping layer 114c may include a silicon oxynitride layer formed by a CVD process using dichlorosilane (DCS)/ammonia ($NH_3$) and nitrous oxide ($N_2O$)/$NH_3$ gas mixtures in ratios and at flow rates tailored to provide a silicon-rich and oxygen-rich oxynitride layer. In one alternative embodiment, the stoichiometric composition of oxygen, nitrogen and/or silicon of first and second charge-trapping layers 114a & 114c may be identical or approximate to one another.

In another embodiment, there may be a middle dielectric and/or oxide layer 114b formed between the first and second charge-trapping layers 114a & 114c, making the multi-layer charge trapping layer 114' an Nitride-Oxide-Nitride (NON) structure/stack. In one embodiment, the middle oxide layer 114b may include $SiO_2$ and/or oxygen-rich dielectric that is charge traps free. The middle oxide layer 114b may substantially reduce the probability of electron charge that accumulates at the boundaries of the first charge-trapping layer 114a during programming from tunneling into the second charge-trapping layer 114c, resulting in lower leakage current than for conventional memory devices. In one embodiment, the middle oxide layer 114b is formed by oxidizing to a chosen depth using thermal or radical oxidation or deposition processes, such as CVD and ALD.

As used herein, the terms "oxygen-rich" and "silicon-rich" are relative to a stoichiometric silicon nitride, or "nitride," commonly employed in the art having a composition of ($Si_3N_4$) and with a refractive index (RI) of approximately 2.0 at 633 nm. Thus, "oxygen-rich" silicon oxynitride corresponds to a shift from stoichiometric silicon nitride toward a higher weight percentage of silicon and oxygen (i.e. reduction of nitrogen). An oxygen rich silicon oxynitride film is therefore more like silicon dioxide and the RI is reduced toward the 1.45 RI of pure silicon dioxide. Similarly, films described herein as "silicon-rich" correspond to a shift from stoichiometric silicon nitride toward a higher weight percentage of silicon with less oxygen than an "oxygen-rich" film. A silicon-rich silicon oxynitride film is therefore more like silicon and the RI is increased toward the 3.5 RI of pure silicon.

Figure 2M:
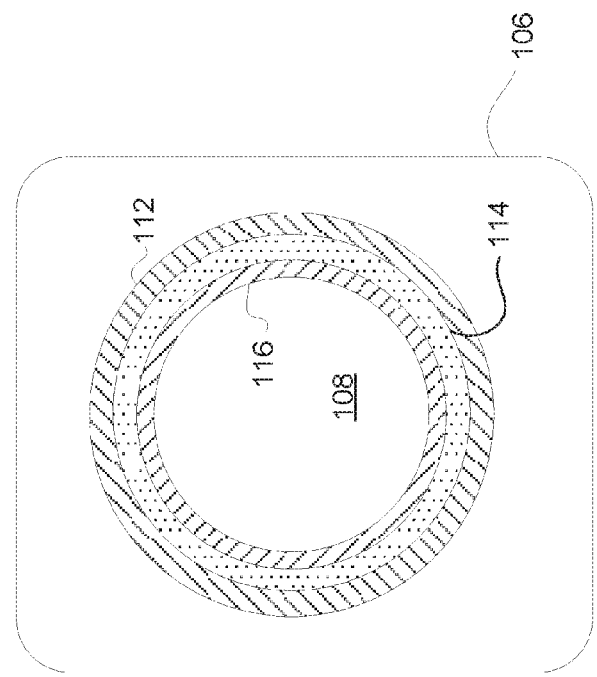
Figure 2L:
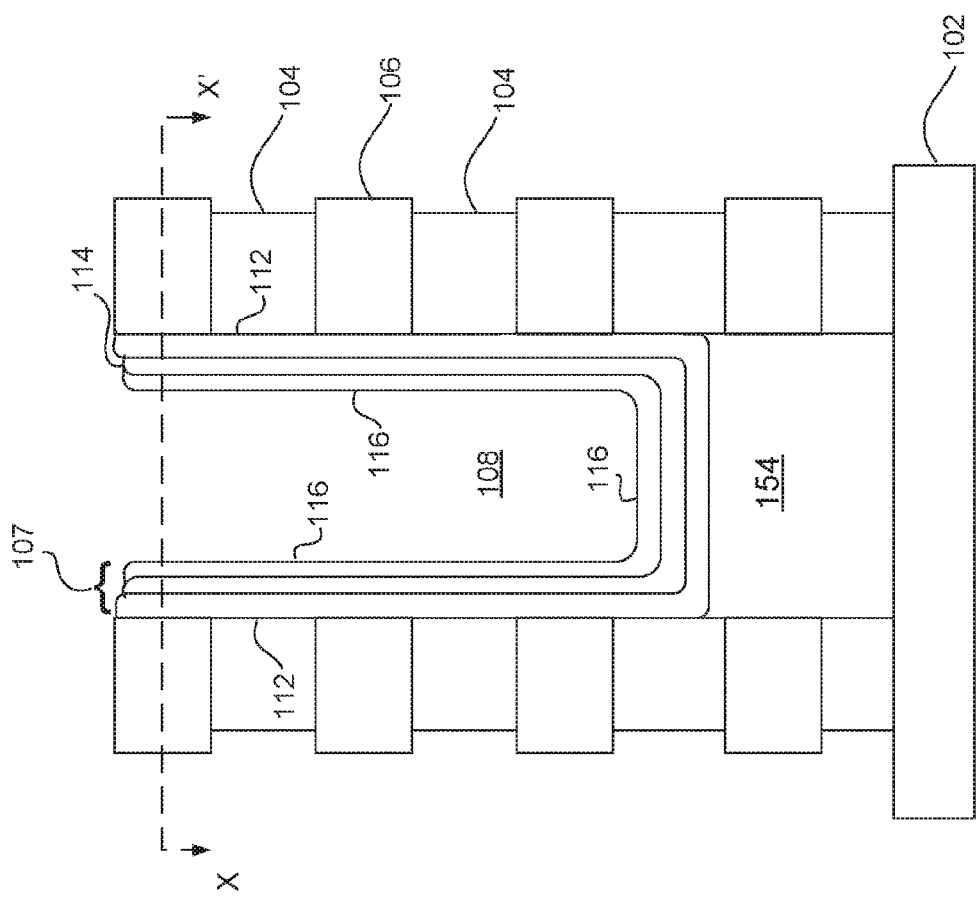

FIG. 2L is a side cross-sectional view of one embodiment of a portion of vertical NV memory device 200 and FIG. 2M is a top cross-sectional view along X-X' of FIG. 2L. Referring to FIG. 1 and FIGS. 2L and 2M, tunnel dielectric layer 116 is formed in opening 108, in step 1014. In one embodiment, tunnel dielectric layer 116 may be formed on or overlying or in contact with the charge-trapping layer 114 within opening 108. For example, a layer of dielectric material may be deposited by CVD or ALD process. In various embodiments, the layer of dielectric material may include, but not limited to silicon dioxide, silicon oxynitride, silicon nitride, aluminum oxide, hafnium oxide, zirconium oxide, hafnium silicate, zirconium silicate, hafnium oxynitride, hafnium zirconium oxide and lanthanum oxide. Generally, tunnel dielectric layer 116 has a relatively uniform thickness of from about 20 Å to about 50 Å or other thicknesses suitable to allow charge carriers to tunnel into the charge-trapping layer 114 under an applied control gate bias while maintaining a suitable barrier to leakage when the applied gate is unbiased. In certain embodiments, tunnel dielectric layer 116 is silicon dioxide, silicon oxynitride, or a combination thereof and can be grown by a thermal oxidation process, using plasma or radical oxidation of a portion of second charge-trapping layer 114c. In yet another embodiment, tunnel dielectric layer 116 may be a bi-layer dielectric region including a first layer of a material such as, but not limited to, silicon dioxide or silicon oxynitride and a second layer of a material which may include, but is not limited to silicon nitride, aluminum oxide, hafnium oxide, zirconium oxide, hafnium silicate, zirconium silicate, hafnium oxynitride, hafnium zirconium oxide and lanthanum oxide.

In one embodiment, blocking dielectric layer 112, charge trapping layer 114 and tunnel dielectric layer 116 may be referred to collectively as charge trapping dielectric or multi-layer dielectric 107.

Figure 2P:
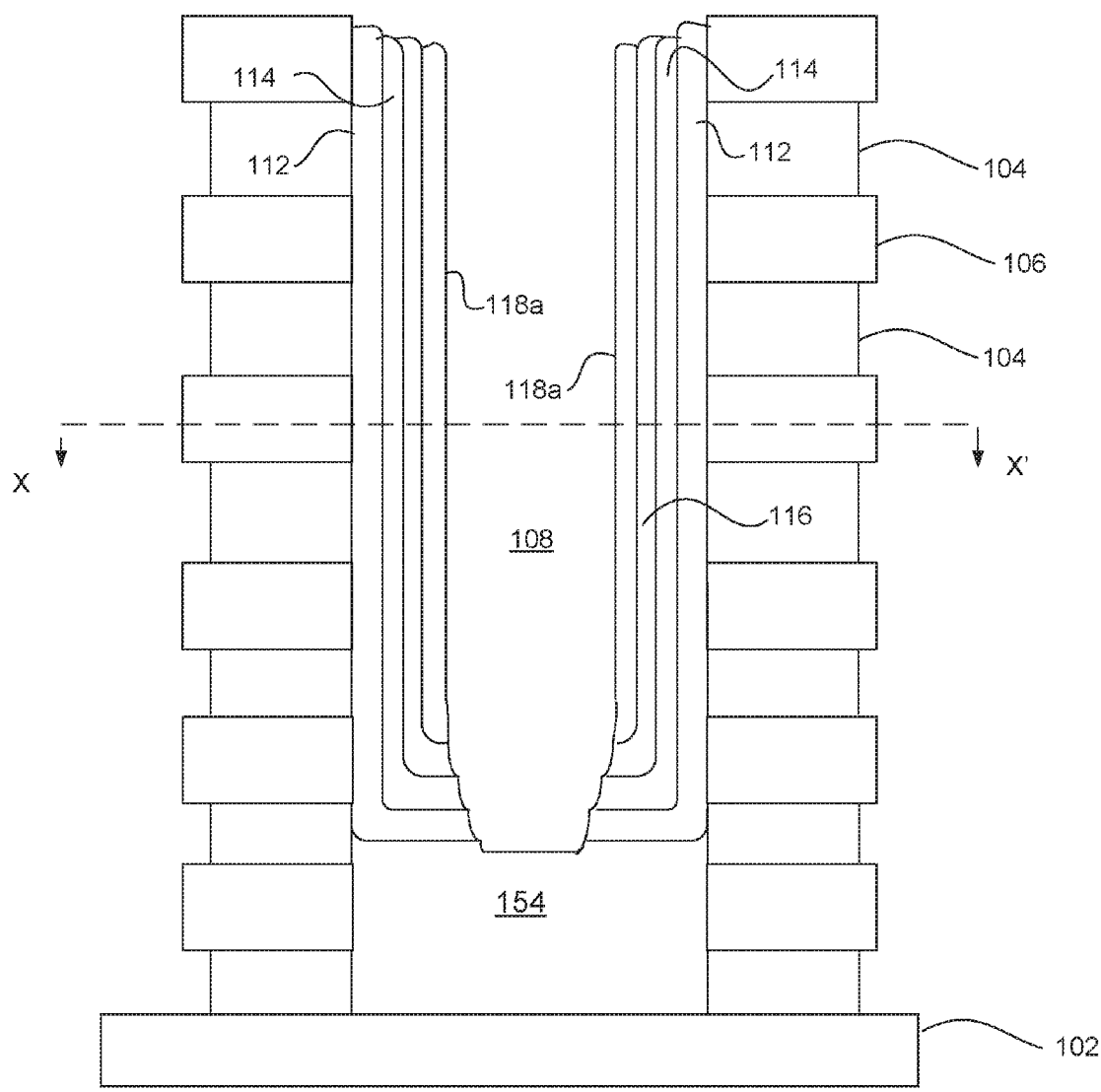

FIG. 2N is a side cross-sectional view of one embodiment of a portion of vertical NV memory device 200 and FIG. 2P is a top cross-sectional view along X-X' of FIG. 2N. In one embodiment, first channel layer or outer channel layer 118a may be formed on, overlying or in contact with the tunnel dielectric layer 116 within opening 108. In general, the first channel layer 118a may include any suitable semiconductor materials, such as silicon, germanium, silicon germanium, or other compound semiconductor materials, such as III-V, II-VI, or conductive or semi-conductive oxides, etc. The semiconductor material may be amorphous, polycrystalline, or single crystal. The first channel layer 118a may be formed by any suitable deposition process, such as low pressure chemical vapor deposition (LPCVD), CVD and ALD. In certain embodiments, the semiconductor channel material may be a recrystallized polycrystalline semiconductor material formed by recrystallizing an initially deposited amorphous semiconductor material.

As previously discussed, it is imperative to maintain an adequately high reading current or on-current flowing through NV memory cell strings 100 to avoid errors during read operations. The potential problem of a weak reading current is made worse when stack 105 includes more inter-cell dielectric layer 104 and gate layer 106 pairs 103 (stair steps) to incorporate more NV memory cells 94 in the NV memory cell strings 100. In certain conventional embodiments, Poly-Si is primarily used to form the channels. The relatively small grain sizes of Poly-Si may lead to a more severe defect of grain boundaries, contributing to more scattering of charge carriers (weak on-current). In one embodiment, it is proposed to form a multi-layer channel 118 in at least two separate steps (steps 1016 and 1018). Referring to FIG. 1, FIGS. 2N and 2O, first channel layer 118a is formed in opening 108, in step 1016. As illustrated in FIG. 2N, first channel layer 118a of vertical NV memory device 200 is vertical and substantially perpendicular to a top surface of substrate 102, which has an opposite orientation of the channels in 2-D geometry. First channel layer 118a is disposed using a CVD process, such as LPCVD and plasma-enhanced chemical vapor deposition (PECVD). The first channel layer 118a may include a silicon-germanium (Si—Ge) composite layer. The concentration of Ge in the Si—Ge composite layer may range from 1% to 99% by no. of Ge atoms. In one embodiment, the concentration is kept at around 5% Ge to 95% Ge. In certain embodiments, first channel layer 118a may include only Poly-Si or Poly-Ge. In one embodiment, the first channel layer 118a may have a relative uniform thickness of from about 50 Å to about 150 Å or other thicknesses. One advantage of having Ge in first channel layer 118a is that Si—Ge composite layer may have higher electron and/or hole mobility. Consequently, reading or on-current through first channel layer 118a may be maintained at a higher level. During the deposition process, semiconductor source may be selected from the group of $GeH_2Cl_2$, $Ge_2H_6$, $GeH_4$, $SiH_2Cl_2$, $Si_3H$, $Si_2H_6$, $SiH_4$, and a combination thereof. Gas LTO520 may be used to enhance seed formation during the deposition process in small openings, such as opening 108. Moreover, Si—Ge layer has a lower melting point than Si/Poly-Si and thus yields relatively larger grains than Si/Poly-Si. Hence, the Si—Ge layer of first channel layer 118a may have less defects such as grain boundaries which may adversely affect reading current as previously discussed. The Si—Ge layer also allows possible Band-gap engineering in first channel layer 118a since Si—Ge layer may have different band-structure depending on the Ge concentration.

In some embodiments, first channel layer 118a may contain un-doped or electrically neutral semiconductor channel material as discussed above. Depending on the device performance requirements, in another embodiment, the semiconductor channel material may be lightly doped with positive-typed dopants, such as boron. In one embodiment, first channel layer 118a is formed by in-situ boron-doped CVD technique. During the deposition process, approximately 0.01% to 1% of boron source, such as $BCl_3$ or $B_2H_6$ in $SiH_4$ is introduced, and the process is carried out in a temperature at approximately 530° C. In one embodiment, the concentration of dopant in first channel layer 118a may be from about 1e15 $cm^{-3}$ to about 1e18 $cm^{-3}$ or other appropriate concentrations. In other embodiments, dopants such as gallium or indium may be used alternatively or additionally. Deposition processes, such as conformal implant technique, plasma-immersion ion implantation, that are capable of high aspect ratio may also be used.

FIG. 2P is a side cross-sectional view of one embodiment of a portion of vertical NV memory device 200. Referring to FIGS. 1 and 2P, the process of multi-layer punch or etch is performed, in step 1018. In one embodiment, the multi-layer punch may be performed to remove a portion of the semiconductor-oxide-nitride-oxide (SONO) layers and/or other layers. As illustrate in FIG. 2N, first channel layer 118a is physically and electrically isolated from SEG structure 154 by at least the blocking dielectric layer 112, charge trapping layer 114 and tunnel dielectric layer 116. An etching process is performed to remove layers previously deposited at the bottom of opening 108. In one embodiment, plasma etch process is performed until the bottom of opening 108 at least reaches or gouges into SEG structure 154. Etchant may include fluorine-based chemicals, such as $CF_4$, $C_4F_6$, $CH_2F_2$, $NF_3$, and $O_2$ and Ar. In one embodiment, multi-layer punch is performed to remove a portion of multi-layer dielectric 107 and first channel layer 118a disposed at the bottom of opening 108 until SEG structure 154 is exposed.

In one embodiment, after the multi-layer punch, first channel layer 118a may be physically and/or electrically isolated from SEG structure 154.

Figure 2Q:
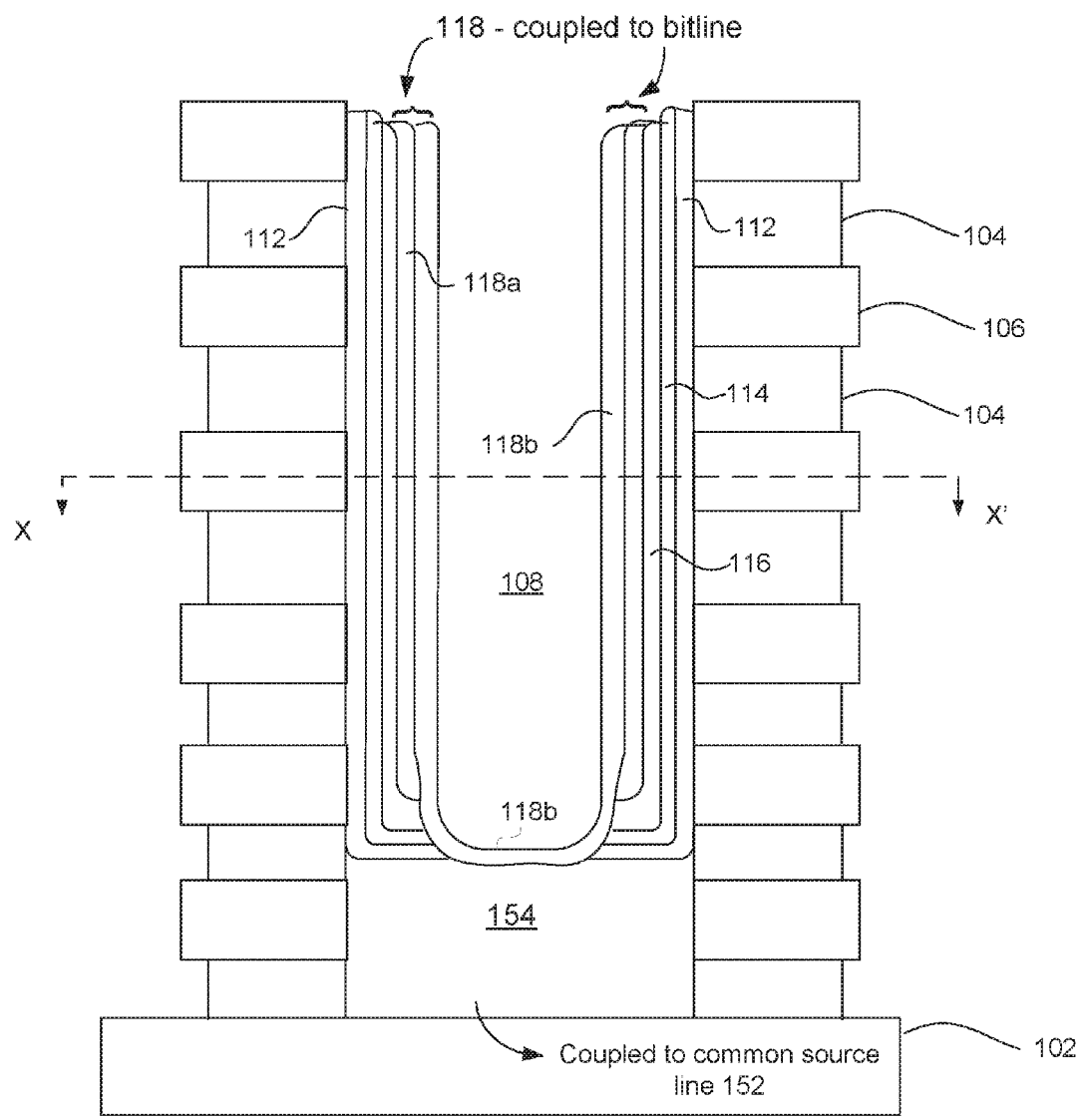

FIG. 2Q is a side cross-sectional view of one embodiment of a portion of vertical NV memory device 200. Referring to FIGS. 1 and 2Q, second channel layer or inner channel layer 118b is formed in opening 108, in step 1018. As illustrated in FIG. 2Q, second channel layer 118b is deposited and over first channel layer 118a and the bottom of opening 108 created by the previously discussed multi-layer punch or etch process. Second channel layer 118b is disposed using similar CVD process as those used in forming the first channel layer 118a in step 1016. Same as the first channel layer 118a, second channel layer 118b may include a silicon-germanium (Si—Ge) composite layer. The concentration of Ge in the Si—Ge composite layer may range from 1% to 99%. In one embodiment, the concentration is kept at around 5% Ge to 95% Ge concentration (no. of Ge atoms based). In certain embodiments, second channel layer 118b may include only Poly-Si or Poly-Ge. In one embodiment, the second channel layer 118b may have a relative uniform thickness of from about 50 Å to about 150 Å or other thicknesses. Second channel layer 118b may also be either undoped or slightly and positively doped by similar processes and concentration in forming the first channel layer 118a. In one embodiment, first and second channel layers 118a and 118b form the channel 118 for the NV memory cell strings 100. In another embodiment, channel 118 may be a single layer. As best illustrated in FIG. 2Q, second channel 118b is electrically and may be physically coupled to SEG structure 154 and first channel layer 118a, reconnecting the two elements. SEG structure 154 may then be electrically coupled to common source line 152 (not shown in this figure). Second channel 118b may, in some embodiments, physically connecting SEG structure 154 to first channel layer 118a. In various embodiment, first and second channel layers 118a and 118b may have different Ge concentration in each of its Si—Ge composite layer. In one embodiment, Ge concentration is higher in the first channel layer 118a and the silicon/Poly-Si concentration in the second channel layer 118b is higher. In this embodiment, the higher Ge concentration may increase the on-current in the first channel layer 118a, while the higher Si/Poly-Si concentration in the second channel layer 118b may provide better lattice matching with SEG structure 154, and effective back interface with dielectric filler 120 (not shown in this figure) formed subsequently. The formation of dielectric filler 120 will be discussed in later sections. Thickness ratio between the first and second channel layers 118a and 118b may range from about 1:5 to about 1:0.2. In one embodiment, the thickness ratio between the first and second channel layers 118a and 118b is configured to be about 1:1.

Figure 2R:
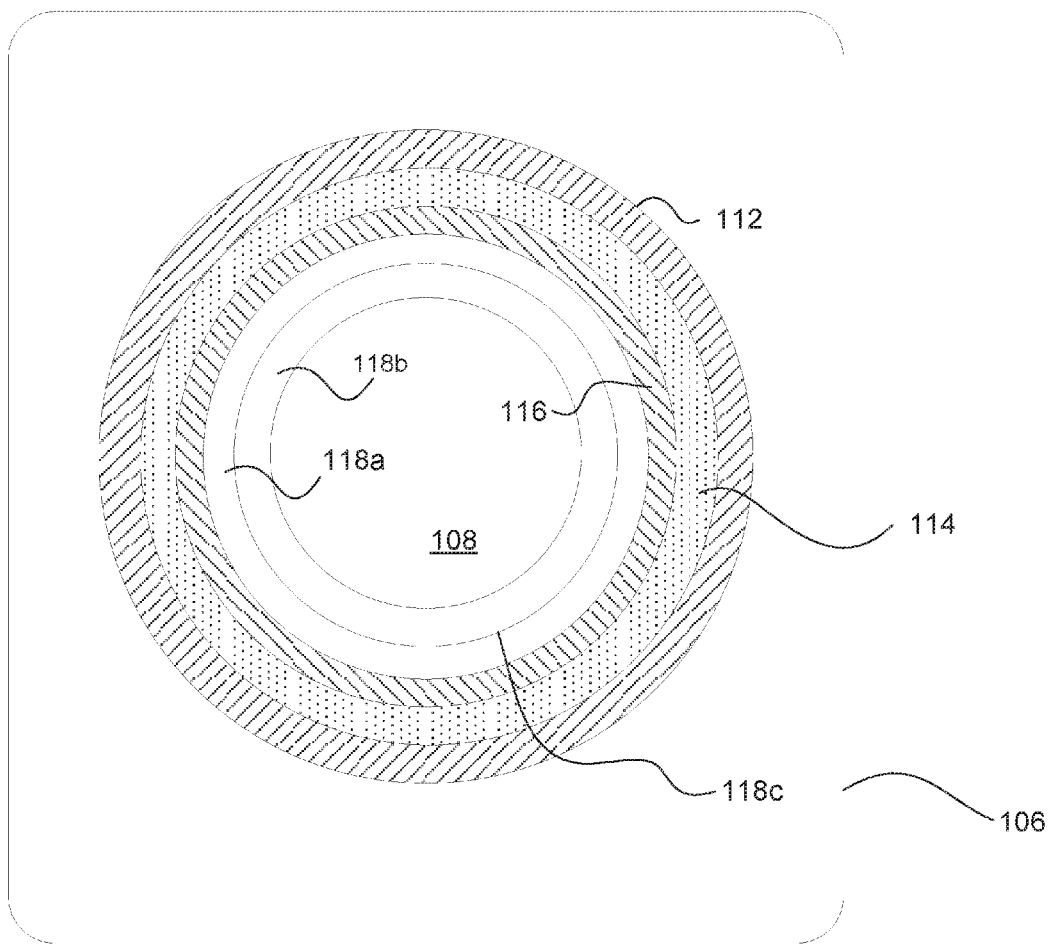
Figure 2T:
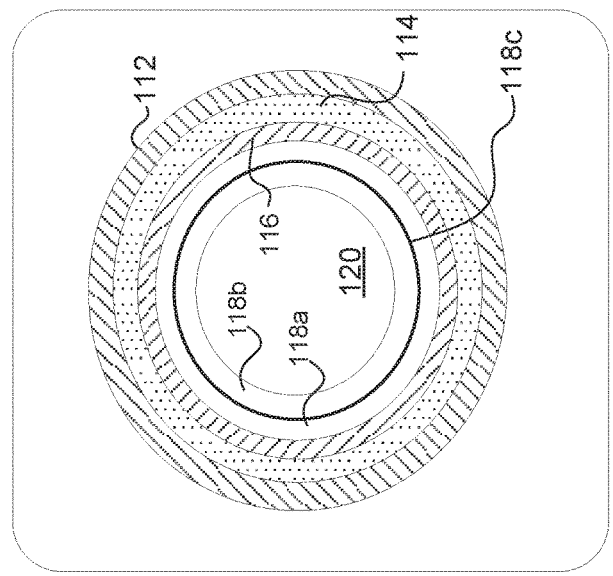

FIG. 2R is a top cross-sectional view along X-X' of FIG. 2Q. As illustrated in FIG. 2R, first and second channel layers 118a and 118b are adjacent to and/or in contact with one another. There may be a channel interface 118c between the two channel layers 118a and 118b for the following possible reasons: 1. Difference in Ge concentration; 2. Difference in grain sizes; 3. Difference in Band-structure; 4. Two separated deposition steps (steps 1016 and 1018) separated by an etching step; and 5. Inner (top) surface of first channel layer 118a is treated with etchants during the multi-layer punch or etch step 1018 before receiving the second channel layer 118b.

In one embodiment, one or more additional channel layer (not shown) may be deposited over second channel layer 118b according to system requirements. The additional channel layer(s) over the second channel layer 118b may be deposited in a similar process steps as the first and second channel layers 118a & 118b. The Ge concentration, thickness of the additional channel layer(s) may be similar or different from the first and second channel layers 118a & 118b. In one embodiment, the inner most channel layer may have a relatively lower Ge concentration to reduce formation of Ge oxide during formation of dielectric filler 120 (not shown in this figure). The additional channel layer(s) may be formed in one step or multiple steps.

Figure 2S:
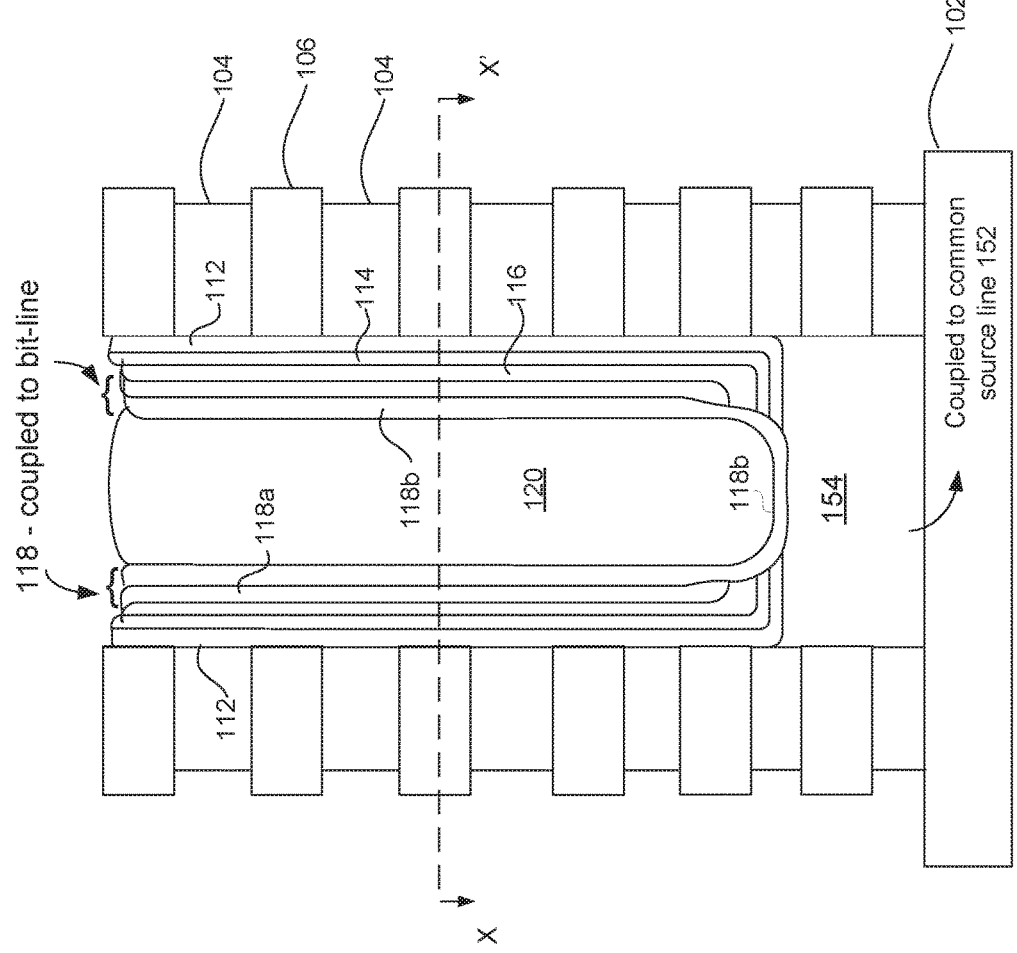

FIG. 2S is a side cross-sectional view of one embodiment of a portion of vertical NV memory device 200 and FIG. 2T is a top cross-sectional view along X-X' of FIG. 2S. Referring to FIG. 1, FIGS. 2S and 2T, dielectric filler 120 is formed in opening 108 to fill out empty space in opening 108 after second channel layer 118b is formed, in step 1020. In one embodiment, dielectric filler 120 includes dielectric materials, such as silicon dioxide, silicon nitride, and silicon oxynitride. Dielectric filler 120 may be formed by deposition methods, such as CVD or ALD, or oxidation methods, such as plasma or radical oxidation technique or thermal RTO.

FIG. 2U is a side cross-sectional view of one embodiment of a portion of NV memory cell string 100 of vertical NV memory device 200 and FIG. 2V is a top cross-sectional view along X-X' of FIG. 2U. Referring to FIG. 1, FIGS. 2U and 2V, metal gate layer 123 is formed to replace gate layers 106 disposed between inter-cell dielectric layers 104 in stack 105, in step 1022. In one embodiment, gate layers 106, which include silicon nitride, are removed firstly using a wet etch process. Vertical NV memory device 200 is dipped in wet etch chemical, such as phosphoric acid ($H_3PO_4$) in a temperature range of from about 150° C. to about 170° C., for about 50 minutes (mins) to about 120 mins. In one embodiment, photoresist layers or hard marks (not shown) may be formed to protect other layers from etchants. Once gate layers 106 are removed, the removed gate layers 106 are then replaced by metal gate layers 123, in which each metal gate layer 123 includes a gate coating layer 124 and a gate filler layer 122. In one embodiment, the process may start by forming gate coating layer 124 of titanium nitride (TiN) using a suitable deposition process, such as metalorganic CVD (MOCVD) or ALD. When the process is completed, the deposited layer becomes gate coating layer 124 that coats or lines the space defined by two neighboring inter-cell dielectric layers 104 and blocking dielectric layer 112. In various embodiments, the coating of the space may be complete or partial. Subsequently, the remaining space is filled by a layer of conductive material, such as tungsten (W), using a metal CVD process. In one embodiment, TiN coating as the gate coating layer 124 improves surface properties. The combination of TiN and W to form metal gate layer 123 is one of the combinations of the present embodiment. Other combinations using different conductive materials to form metal gate layers 123 may include but are not limited to metal nitrides, metal carbides, metal silicides, hafnium, zirconium, titanium, tantalum, aluminum, ruthenium, tungsten, palladium, platinum, cobalt, and nickel, which are known in the art and may be adopted. In one alternative embodiment, instead of forming metal gate layers 123, polysilicon gate layers is formed by deposition process, such as CVD and ALD. In one embodiment, polysilicon doped with appropriate dopants at an operational concentration that are known in the art may be deposited. In another alternative embodiment, before gate coating layer 124 is deposited, a layer of high-K dielectric 125 is deposited to coat or line the space defined by two neighboring inter-cell dielectric layers 104 and blocking dielectric layer 112, either completely or partially. The layer of high-K dielectric 125 may include $Al_2O_3$ and be deposited by ALD.

Figure 2W:
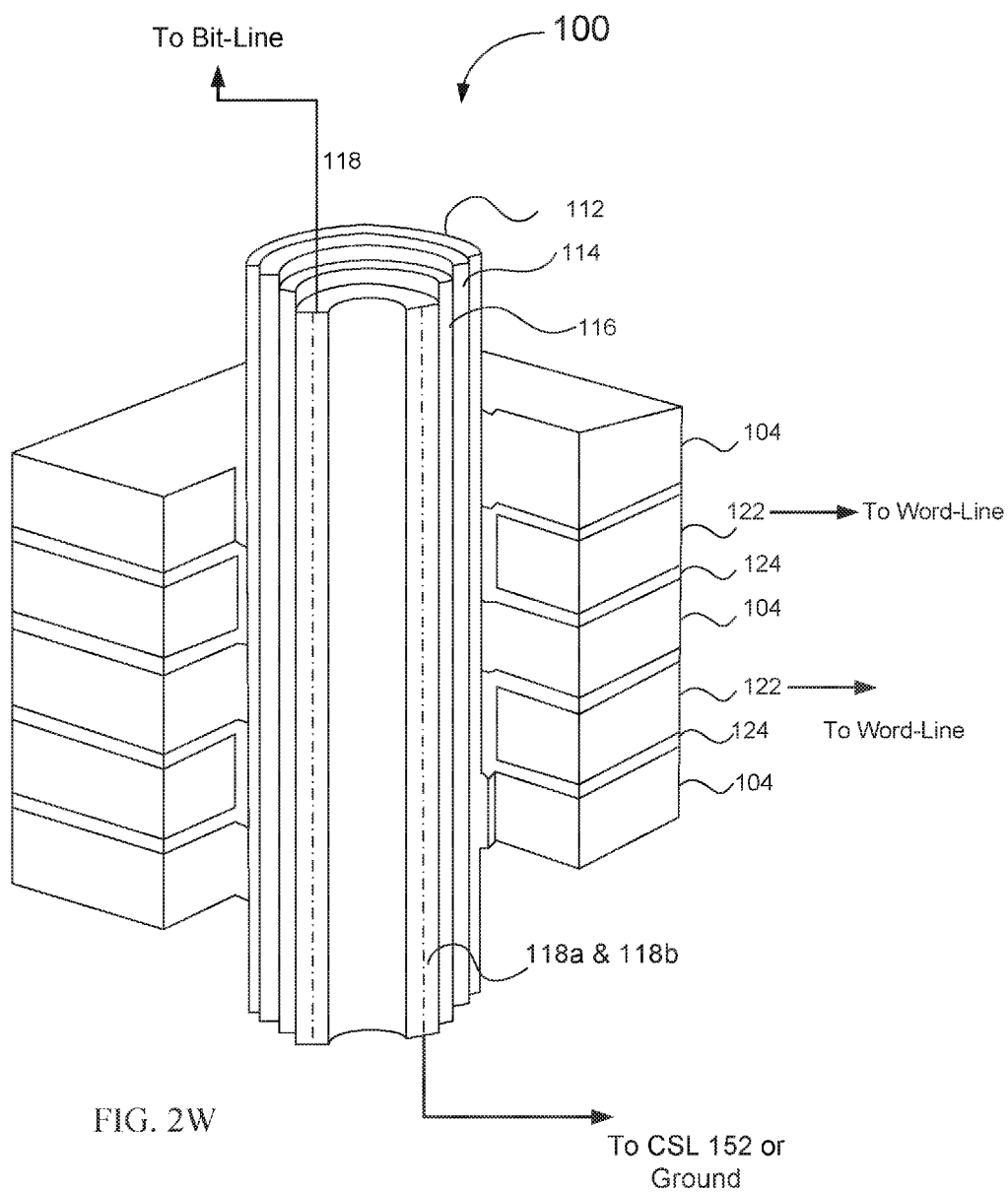

In one embodiment, as shown in FIGS. 2U and 2W, after metal gate layers 123 or polysilicon gate layers are formed, NV memory cell strings 100 is primarily completed. The embodiment shown in FIG. 2U features five NV memory cells 94. It will be understood by one having ordinary skill in the art that other quantities of NV memory cells 94 in one NV memory cell strings 100 may be fabricated using the process steps disclosed herein by having more stair steps 103 in stack 105. In one embodiment, the completed NV memory cell string 100 includes a string of NV memory cells 94 connected in series (by channel layer 118), in which metal gate layers 123 or polysilicon layers correspond to control gates and portions of channel layer 118 adjacent to inter-cell dielectric layers 104 to source/drain regions of individual NV memory cells 94. As mentioned, there may be semiconductor devices other than NV memory cells 94, such as field-effect transistors (FET) or connecting elements formed in the bottom intervening layers and top additional layers in stack 105 and over/within wafer 102. For example, a connecting structure (not shown) is formed on or within wafer 102 to connect SEG structure 154 to common source line 152. In one embodiment, channel layer 118, including first and second channel layers 118a and 118b, represents a shared channel for all NV memory cells 94 within one opening 108 of the NV memory cell strings 100.

Referring to FIGS. 2B and 2W, in one embodiment, vertical NV memory cell strings 100 in the same vertical NV memory device 200 may be fabricated concurrently or sequentially. Each NV memory cell 94 on the same layer of stack 105 shares a same metal gate layer 123 which includes gate coating layer 124 and gate filler layer 122. In one embodiment, metal gate layer 123 either functions as a common word-line or is coupled to a common word-line for NV memory cells 94 of the same vertical layer in vertical NV memory device 200. Vertical NV memory cell strings 100 may have one top end coupled to a bit-line and one bottom end coupled to a common source-line 152 via channel layer 118 and SEG structure 154. In one embodiment, one or more vertical NV memory cell strings 100 may share one bit-line. In another embodiment, one or more vertical NV memory cell strings 100 may share one common source-line 152. In one embodiment, channel layer 118 may be connected to bit-line via channel plug (not shown) at the top of channel layer 118. It is understood that channel plugs and/or other connecting elements to bit-lines are fabricated in methods practiced by ordinary skill in the art, and will be not be discussed in details herein.

FIG. 2X is a side cross-sectional view along Z-Z' of FIG. 2B of one embodiment of a portion of vertical NV memory device 200 showing common source line structure 152. Referring to FIG. 2B, in one embodiment, according to system requirements, there may be multiple vertical deep CSL slits or trenches 151 created in a particular pattern in stack 105, by etching method such as plasma etching and wet etching. Within each deep CSL trench 151, as best illustrated in FIG. 2X, a CSL structure 152 is formed. In one embodiment, a layer of dielectric 156, such as silicon oxide, is deposited by CVD or ALD in CSL trench 151. Subsequently, source-line 158 that may include electrical conducting material, such as W, may be deposited. In one embodiment, source-line 158 may extend and gouge into wafer 102 and further connected to SEG structure 154 of one or multiple vertical NV memory cell strings 100. The circuit diagram illustrated in FIG. 2Y shows that four vertical NV memory cell strings 100, each has its own bit-line BL1-4, are each coupled electrically to CSL 152. It will be understood that different numbers of vertical NV memory cell strings 100 may share one or multiple CSL 152 and/or bit-lines, according to system requirements.

Thus, embodiments of vertical/3-D NV memory devices/strings/apparatus and methods of fabricating the same have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. § 1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

In the foregoing specification, the subject matter has been described with reference to specific exemplary embodiments thereof. It will, however, be evident that various modifications and changes may be made thereto without departing from the broader spirit and scope of the subject matter as set forth in the appended claims. The specification and drawings are, accordingly, to be regarded in an illustrative sense rather than a restrictive sense.

What is claimed is:

1. A memory device, comprising:
   an opening disposed in a stack including first stack layers and second stack layers over a wafer;
   a multi-layer dielectric disposed over at least an inner sidewall of the opening;
   a first channel layer disposed over the multi-layer dielectric;
   a second channel layer including semiconductor material disposed over the first channel layer; and
   at least one additional channel layer disposed over the second channel layer,
   wherein at least one of the first or second channel layer includes germanium (Ge), and wherein the at least one additional channel layer includes lower Ge concentration than the first or second channel layers.

2. The memory device of claim 1, wherein the at least one of the first or second channel layers includes a silicon-germanium (Si—Ge) composite layer, and wherein the Si—Ge composite layer includes Ge concentration by number of atoms in an approximate range of 5% to 95%.

3. The memory device of claim 1, wherein the first and second channel layers include a poly-crystalline structure.

4. The memory device of claim 1, wherein the at least one additional channel layer includes Ge, and wherein stacking of the first, second channel layers, and the at least one additional channel layer is in a direction perpendicular to a channel length.

5. The memory device of claim 1, further comprising: a channel interface between the first and second channel layers, wherein the first and second channel layers are deposited in two separated deposition steps and each includes a silicon-germanium composite layer of different Ge concentration.

6. The memory device of claim 1, wherein the opening is substantially perpendicular to a top surface of the wafer.

7. The memory device of claim 1, wherein the opening includes a cross-sectional shape selected from a group of: circle, oval, square, diamond, and rectangle.

8. The memory device of claim 1, wherein the multi-layer dielectric comprises a blocking dielectric layer over at least the inner sidewall of the opening, a charge-trapping layer over the blocking dielectric layer, and a tunnel dielectric layer over the charge-trapping layer, wherein the charge-trapping layer includes a multi-layer structure.

9. The memory device of claim 8, wherein the multi-layer structure of the charge-trapping layer includes an outer nitride layer, a middle dielectric layer, and an inner nitride layer, wherein at least one of the outer or inner nitride layers includes silicon oxynitride, wherein one of the outer and inner nitride layers is oxygen-rich and the other is silicon-rich, and wherein the middle dielectric layer is mostly charge-trap free.

10. The memory device of claim 1, wherein:
the first and second stack layers are disposed over one another in an alternating manner to form the stack;
the first stack layers include silicon dioxide ($SiO_2$); and
each of the second stack layers includes a gate layer, wherein the gate layer includes one of a doped poly-crystalline silicon (Poly-Si) layer or a tungsten/titanium nitride (W/TiN) composite layer.

11. The memory device of claim 1, wherein the at least one of the first or second channel layers is positively doped.

12. The memory device of claim 11, wherein the at least one of the first or second channel layers includes a dopant selected from a group of boron, gallium, or indium, and doped at an approximate concentration range of $1e15$ $cm^{-3}$ to $1e18$ $cm^{-3}$.

13. The memory device of claim 1, wherein a thickness ratio between the first and the second channel layers is in an approximate range of 1:5 to 1:0.2.

14. A memory device, comprising:
a stack formed over a wafer, the stack including dielectric layers and gate layers;
a plurality of vertical NAND strings, each formed within a vertical opening formed in the stack and comprising:
a blocking dielectric layer disposed over at least an inner sidewall of the vertical opening;
a multi-layer charge-trapping layer disposed over the blocking dielectric layer;
a tunnel dielectric layer disposed over the multi-layer charge-trapping layer;
a channel including germanium (Ge), wherein the channel further includes an outer channel disposed over the tunnel dielectric layer and an inner channel comprising semiconductor material disposed over the outer channel; and
a selective epitaxial growth (SEG) structure formed at the bottom of the vertical opening, wherein the outer channel is physically isolated from the SEG by the inner channel; and
at least one common source-line (CSL), each formed within a vertical CSL slit formed in the stack,
wherein at least one of the plurality of vertical NAND string is electrically coupled to one of the at least one CSL via the SEG structure.

15. The memory device of claim 14, wherein the channel includes a multi-layer structure comprising an outer channel disposed over the tunnel dielectric layer and an inner channel disposed over the outer channel, wherein at least one of the outer or inner channel layers includes a polycrystalline silicon-germanium (Si—Ge) composite layer including Ge concentration in a range of 5%-95%.

16. The memory device of claim 14, wherein the channel includes a multi-layer structure, and wherein at least one of the outer or inner channel layers includes a polycrystalline Ge (Poly-Ge) layer.

17. The memory device of claim 14, wherein the multi-layer charge-trapping layer includes an outer nitride layer, a middle dielectric layer, and an inner nitride layer, wherein the outer nitride layer is oxygen-lean and includes a majority of charge traps distributed in the multi-layer charge-trapping layer, and wherein the middle dielectric layer includes an oxygen-rich dielectric that is mostly charge traps free.

18. A memory array, comprising:
a stack formed over a wafer including dielectric layers and gate layers;
a plurality of vertical NAND strings, each formed within a vertical opening formed in the stack and comprising:
a multi-layer dielectric disposed over at least an inner sidewall of the vertical opening;
a first channel layer disposed over the multi-layer dielectric;
a second channel layer including semiconductor material disposed over the first channel layer, wherein at least one of the first or second channel layers includes germanium (Ge);
a selective epitaxial growth (SEG) structure formed at the bottom of the vertical opening, the SEG structure is in direct contact with the second channel layer and physically isolated from the first channel layer;
a plurality of word-lines, each coupled to one of the gate layers;
a plurality of bit-lines, wherein each bit-line is coupled to at least one of the plurality of vertical NAND strings at a top end of the first or second channel layers; and
a common source-line (CSL) formed within a CSL slit in the stack, wherein the CSL is coupled to at least one of the plurality of vertical NAND strings at a bottom end of the first or second channel layers via the SEG structure.

19. The memory array of claim 18, wherein at least one of the first or second channel layers include a silicon-germanium composite layer comprising Ge concentration in a range of 5%-95%.

20. The memory array of claim 18, wherein Ge concentration of the first channel layer is higher than Ge concentration of the second channel layer.

* * * * *